(12) United States Patent
Huang et al.

(10) Patent No.: US 12,021,132 B2
(45) Date of Patent: *Jun. 25, 2024

(54) GATE PATTERNING PROCESS FOR MULTI-GATE DEVICES

(71) Applicant: Taiwan Semiconductor Manufacturing Co., Ltd., Hsin-Chu (TW)

(72) Inventors: Mao-Lin Huang, Hsinchu (TW); Lung-Kun Chu, New Taipei (TW); Chung-Wei Hsu, Hsinchu (TW); Jia-Ni Yu, Hsinchu (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/858,544

(22) Filed: Jul. 6, 2022

(65) Prior Publication Data

US 2022/0336632 A1 Oct. 20, 2022

Related U.S. Application Data

(63) Continuation of application No. 16/858,440, filed on Apr. 24, 2020, now Pat. No. 11,387,346.

(51) Int. Cl.
*H01L 29/66* (2006.01)
*H01L 29/06* (2006.01)
(Continued)

(52) U.S. Cl.
CPC .... *H01L 29/66484* (2013.01); *H01L 29/0649* (2013.01); *H01L 29/0669* (2013.01); *H01L 29/1033* (2013.01); *H01L 29/78696* (2013.01)

(58) Field of Classification Search
CPC .......... H01L 29/66484; H01L 29/0649; H01L 29/0669; H01L 29/1033; H01L 29/78696;
(Continued)

(56) References Cited

U.S. PATENT DOCUMENTS 11,387,346 B2 * 7/2022 Huang ............. H01L 29/66439
2016/0254261 A1 9/2016 Machkauotsan et al.
(Continued)

FOREIGN PATENT DOCUMENTS

KR 20160140312 A 12/2016
KR 20170101351 A 9/2017
(Continued)

OTHER PUBLICATIONS

Yu, Jia-Ni, et al., "P-Metal Gate First Gate Replacement Process for Multigate Devices", U.S. Appl. No. 16/834,637, filed Mar. 30, 2020, 43 pages of specification, 24 pages of drawings.

*Primary Examiner* — Tong-Ho Kim
(74) *Attorney, Agent, or Firm* — Haynes and Boone, LLP

(57) ABSTRACT

A device includes a substrate, channel layers over the substrate, a gate dielectric layer around the channel layers, a first work function metal layer around the gate dielectric layer, a second work function metal layer over the first work function metal layer, and a passivation layer between the first work function metal layer and the second work function metal layer. The passivation layer merges in space vertically between adjacent ones of the channel layers.

20 Claims, 38 Drawing Sheets

(51) Int. Cl.
*H01L 29/10* (2006.01)
*H01L 29/786* (2006.01)

(58) Field of Classification Search
CPC ............ H01L 21/823842; H01L 27/092; H01L 29/513; H01L 29/0653; H01L 29/42392; H01L 29/4966; H01L 29/66439; H01L 29/0673; H01L 29/775; H01L 21/823821; H01L 21/823835; H01L 27/0924; H01L 21/823828; H01L 21/823807; B82Y 10/00
USPC .......................................................... 257/369
See application file for complete search history.

(56) References Cited

U.S. PATENT DOCUMENTS

| | | |
|---|---|---|
| 2017/0103986 A1 | 4/2017 | Kim et al. |
| 2018/0308766 A1 | 10/2018 | Mochizuki et al. |
| 2018/0342427 A1 | 11/2018 | Xie et al. |
| 2019/0081152 A1* | 3/2019 | Suh .................. H01L 21/28167 |
| 2020/0083326 A1 | 3/2020 | Ok et al. |
| 2020/0411387 A1 | 12/2020 | Chiang et al. |
| 2021/0134794 A1 | 5/2021 | Huang et al. |

FOREIGN PATENT DOCUMENTS

| | | |
|---|---|---|
| KR | 20190140564 A | 12/2019 |
| KR | 20200014235 A | 2/2020 |
| KR | 102272133 B1 | 4/2021 |
| TW | 202008436 A | 2/2020 |

* cited by examiner

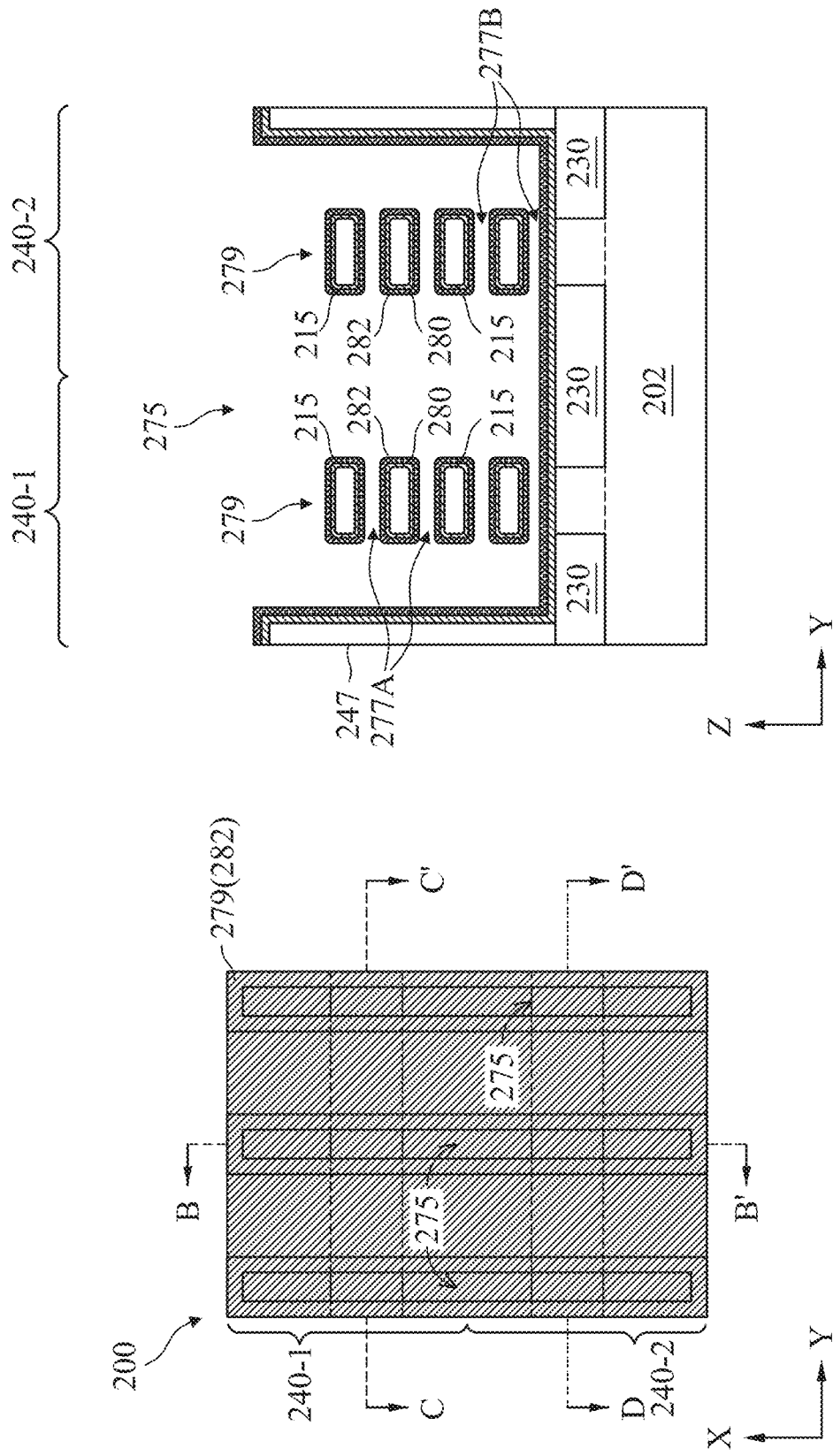

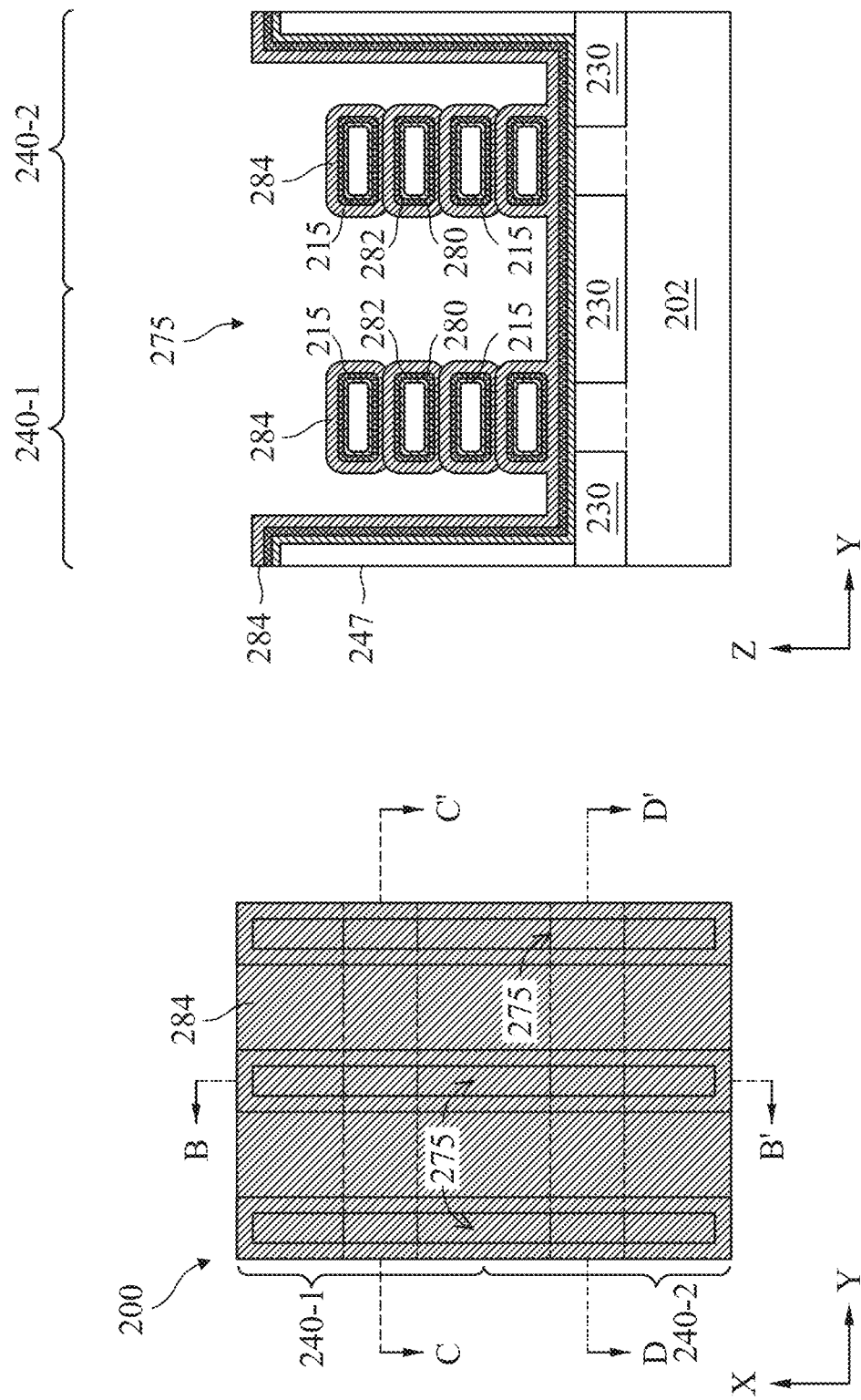

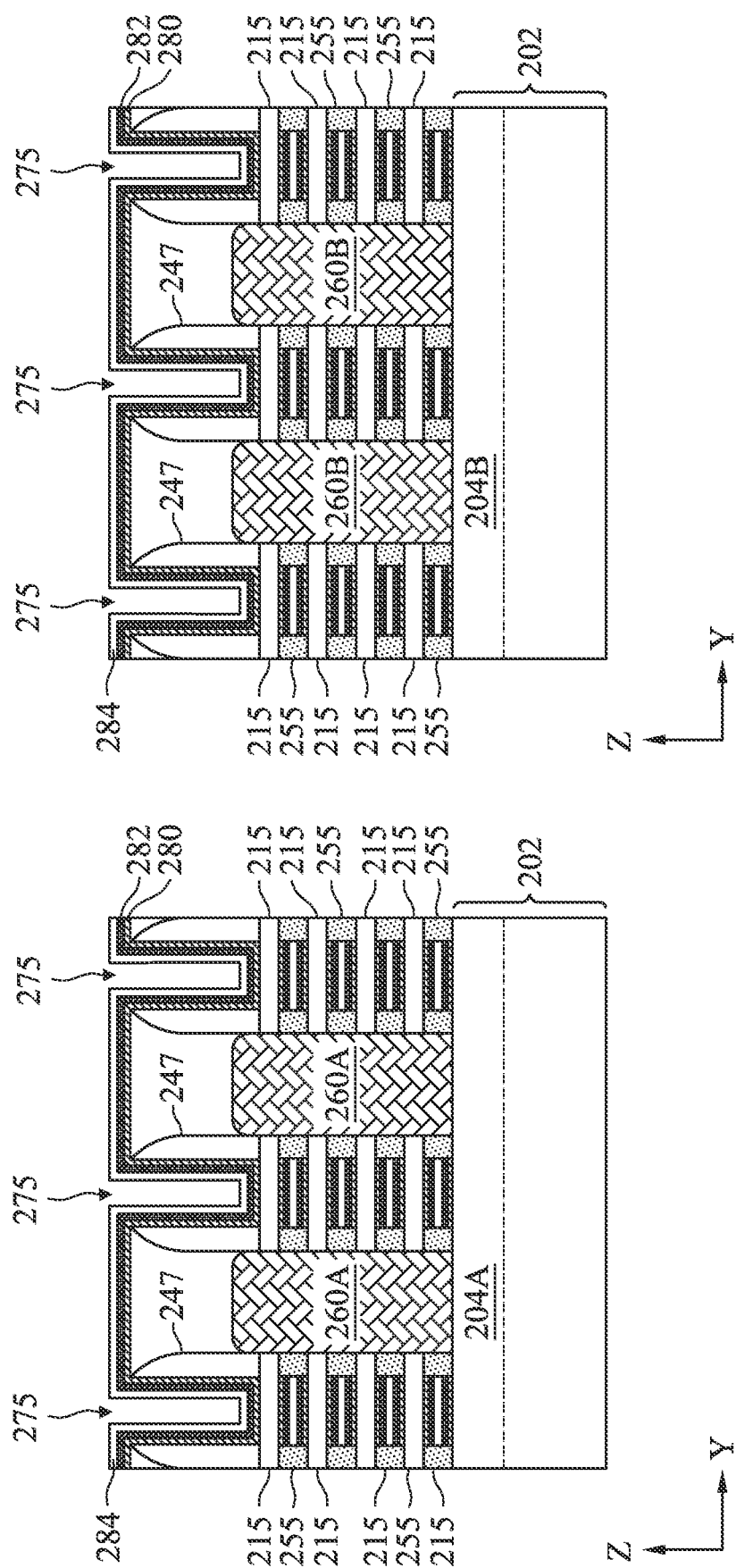

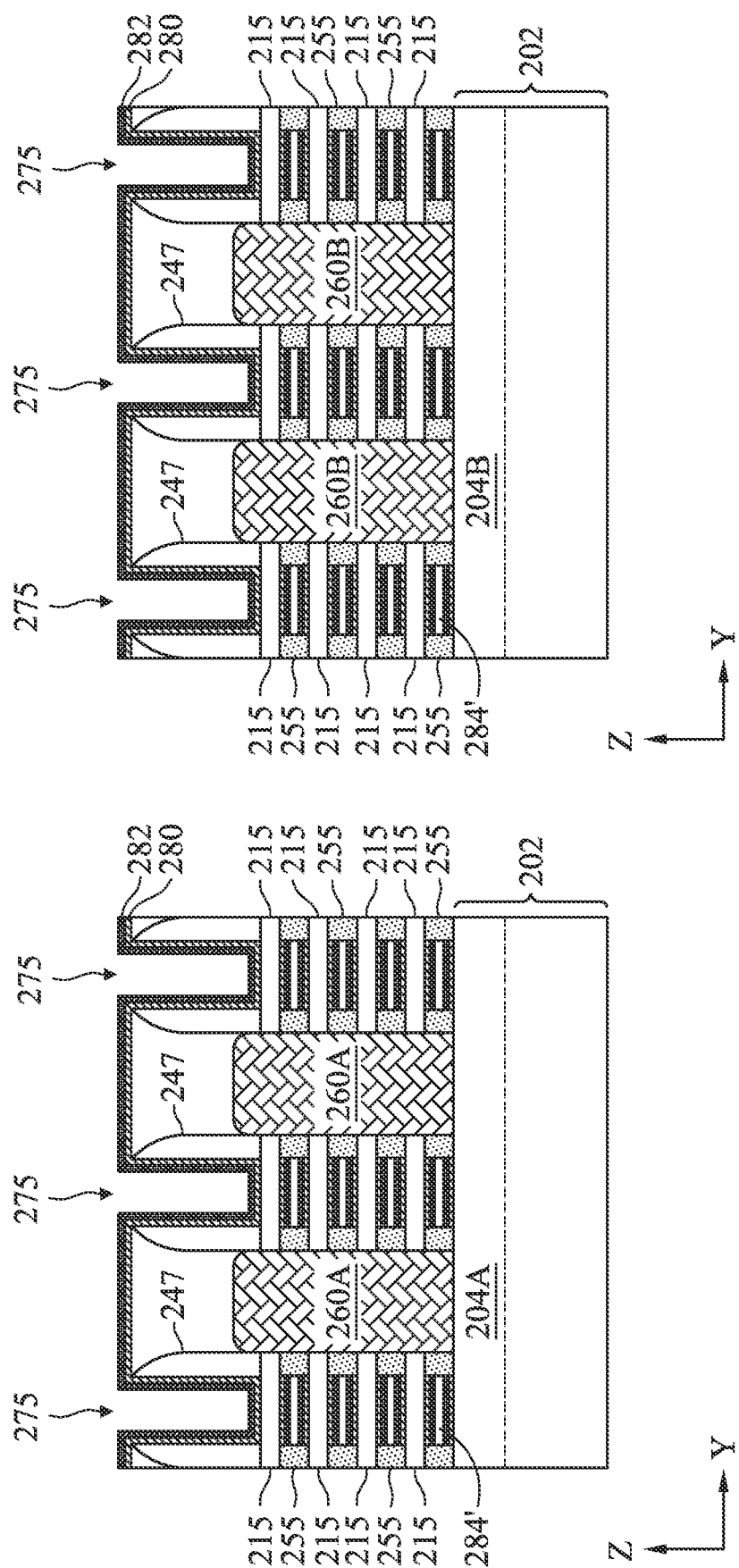

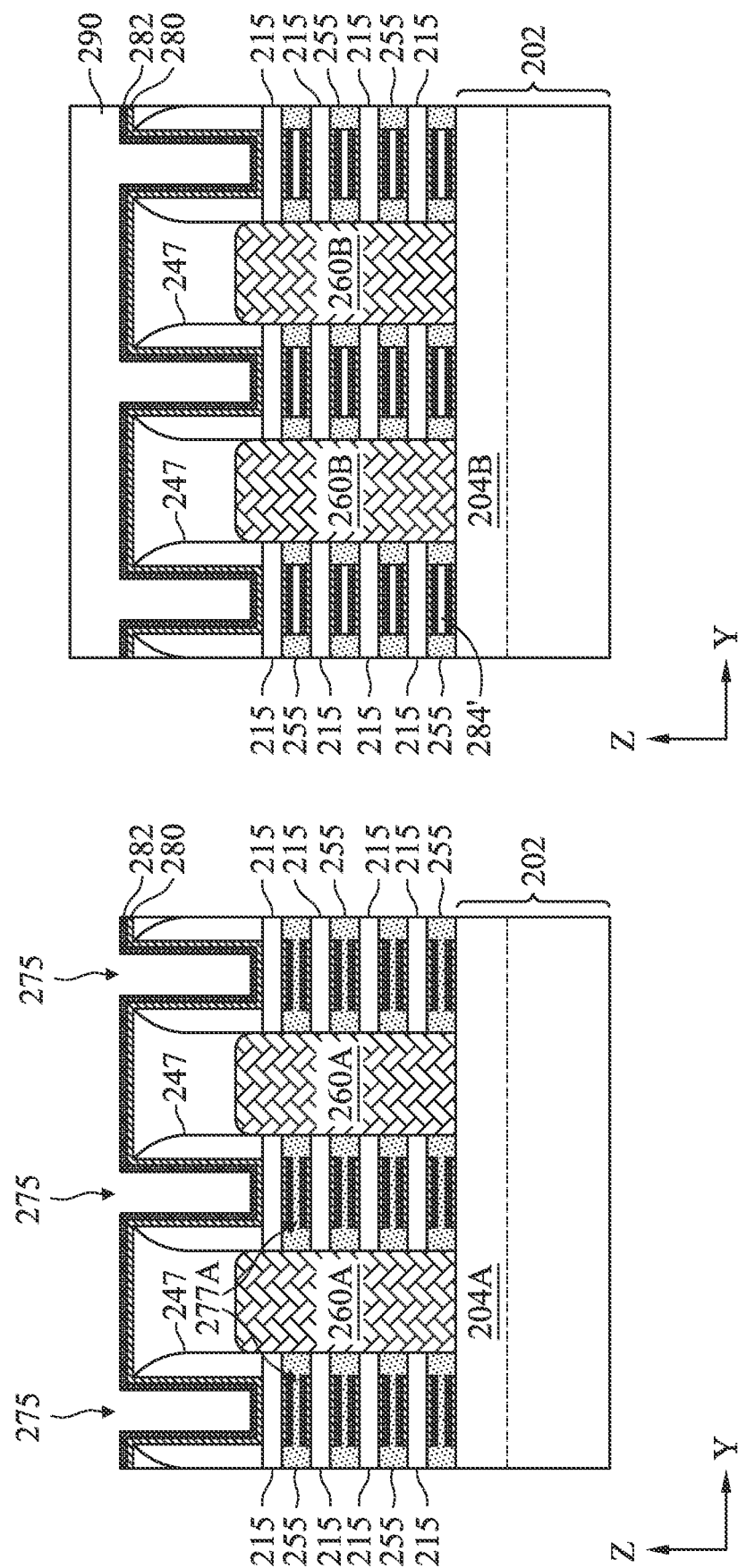

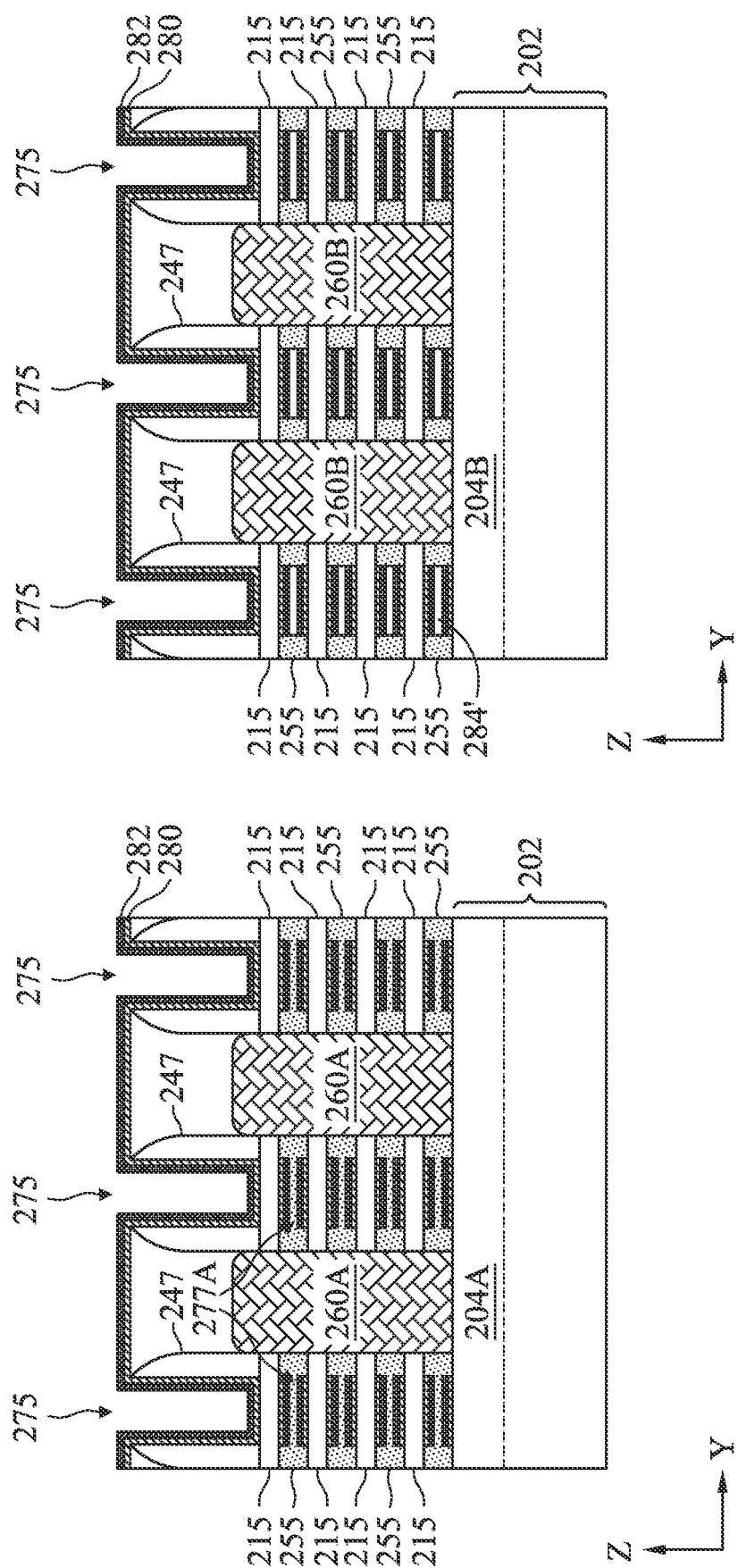

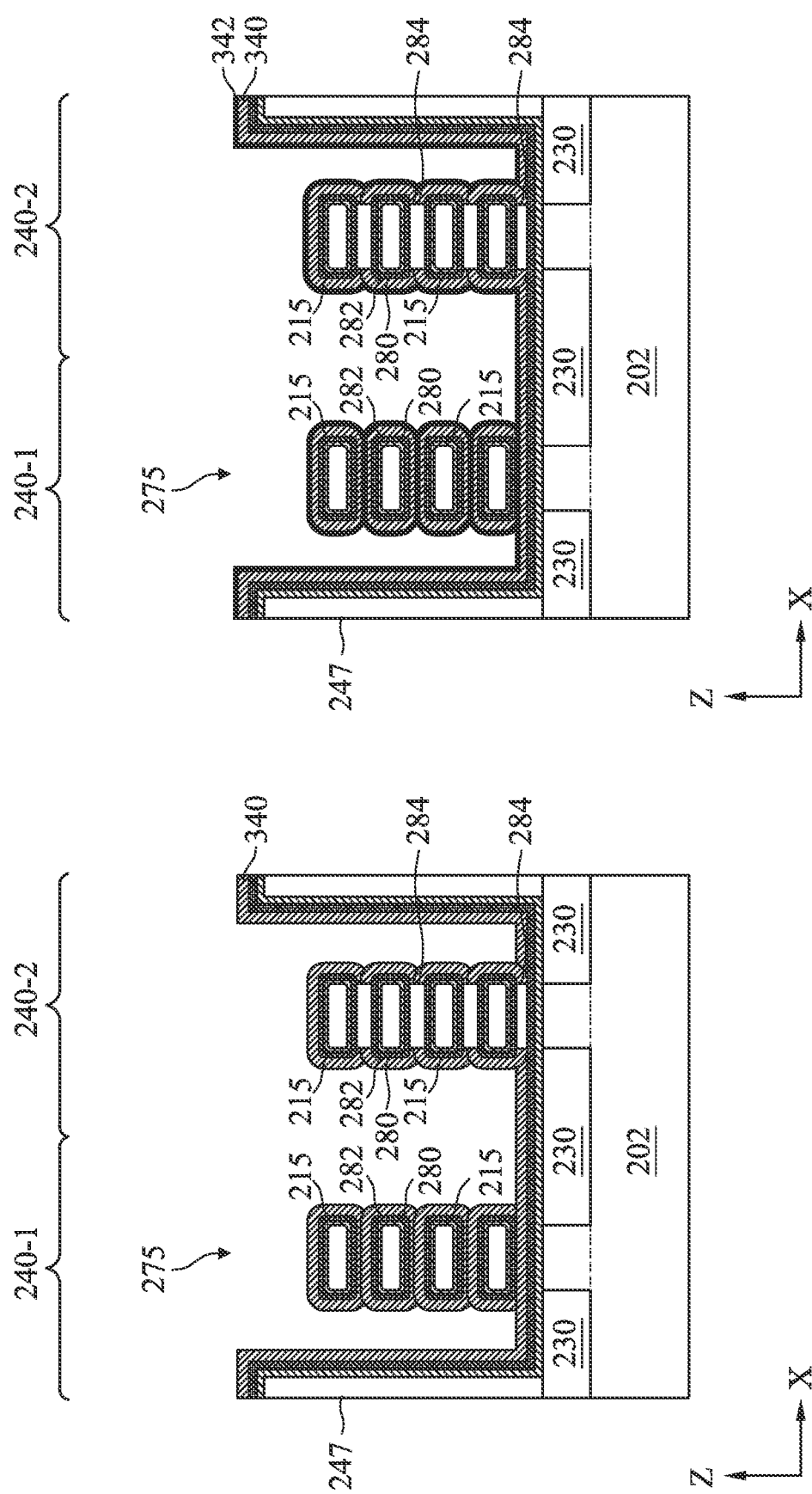

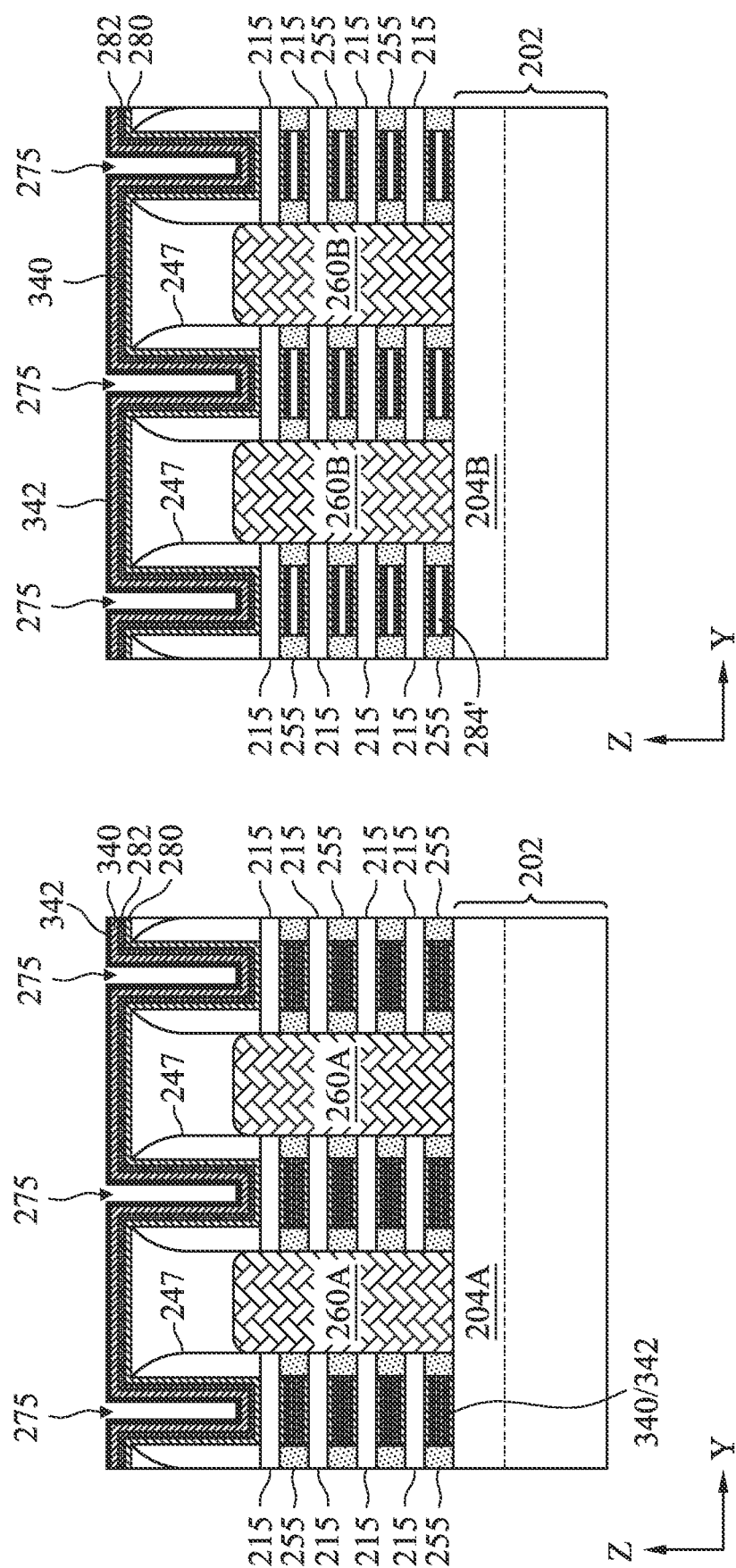

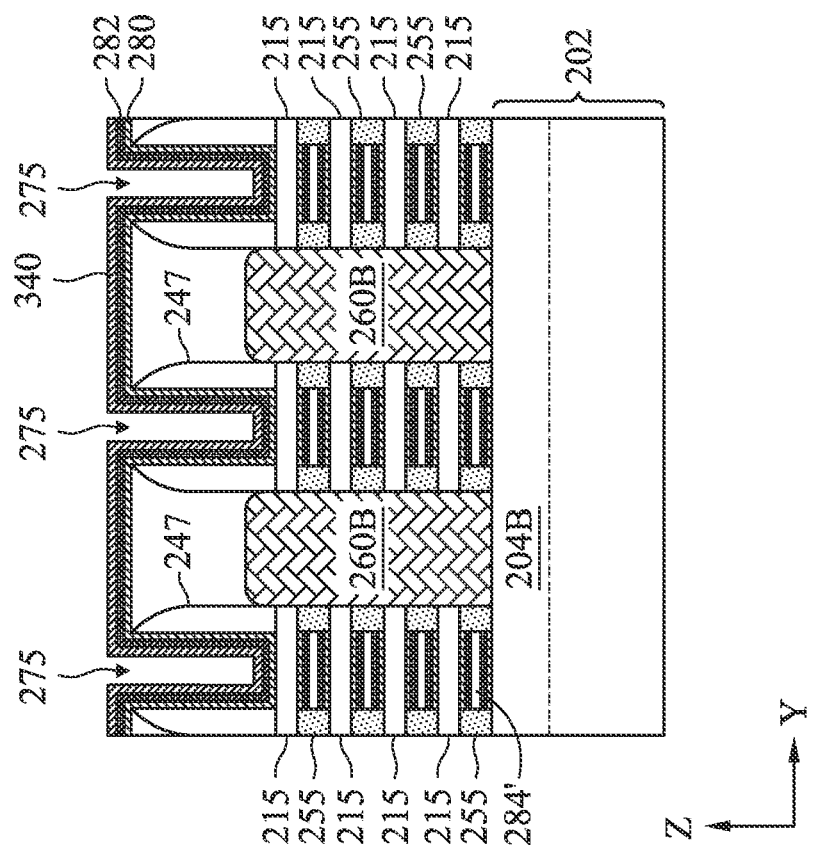
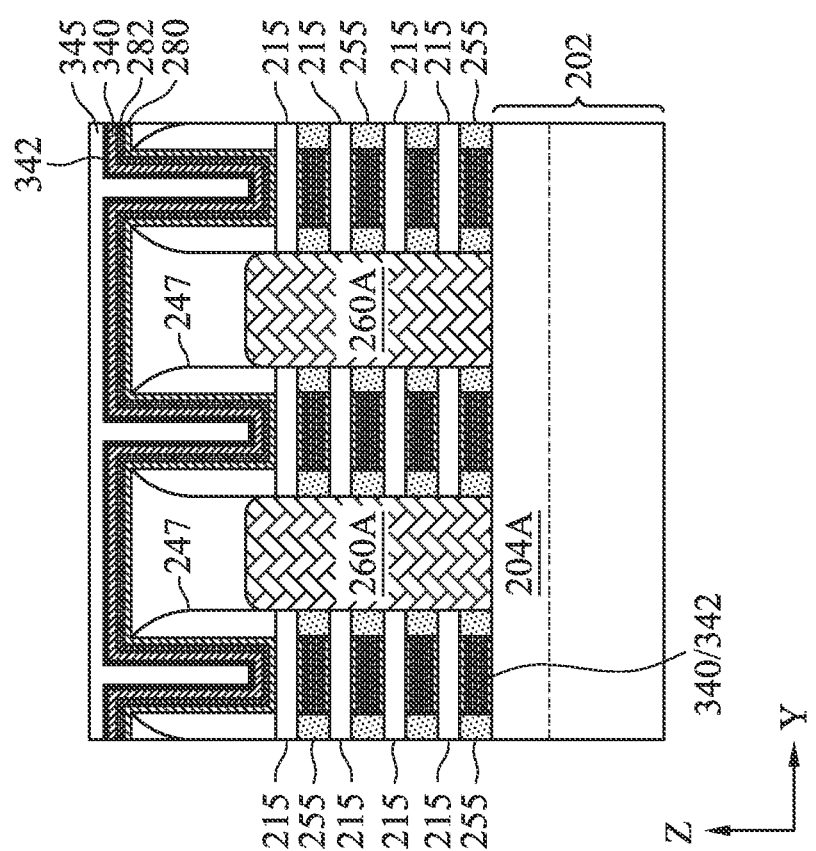
FIG. 12C
FIG. 12D

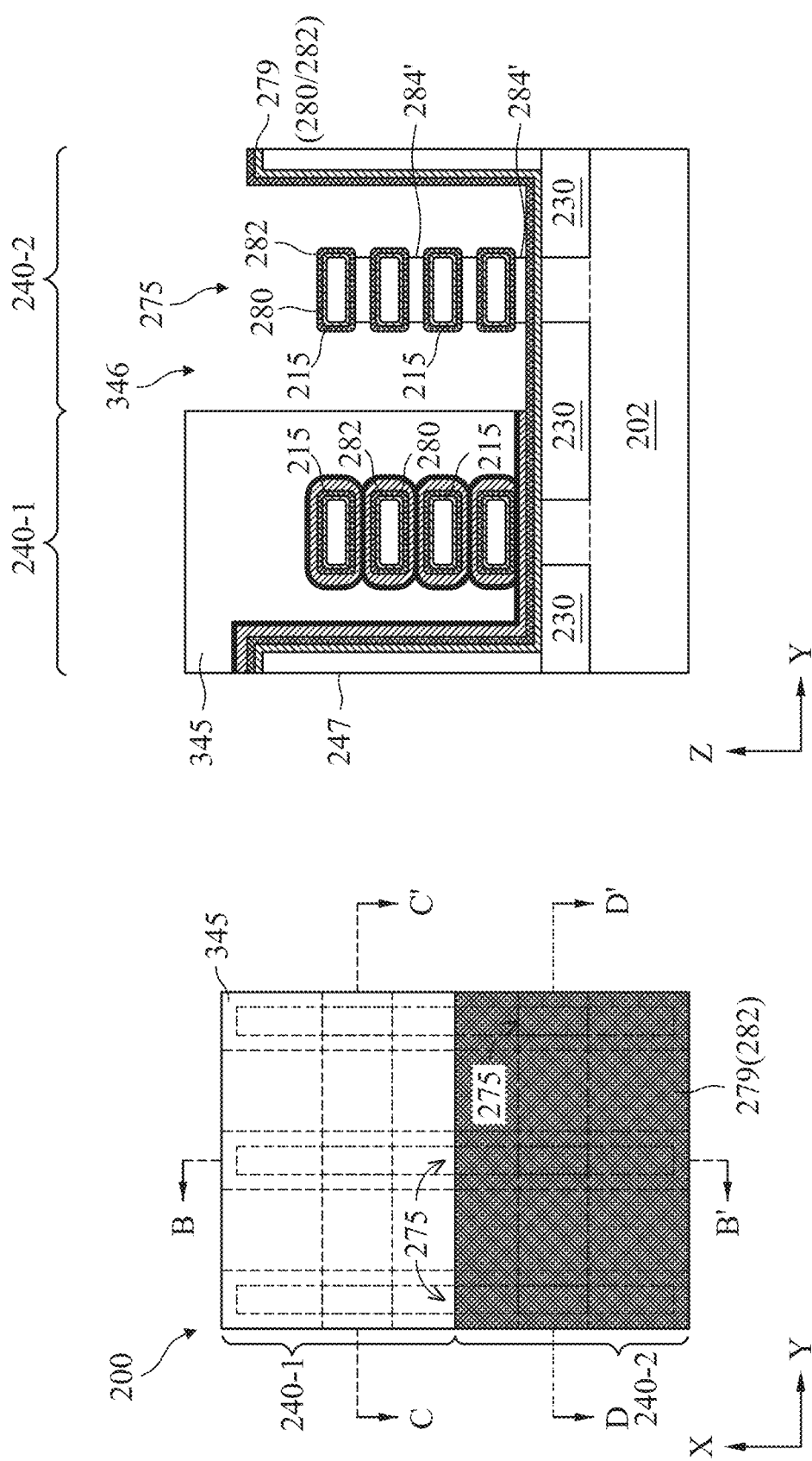

GATE PATTERNING PROCESS FOR MULTI-GATE DEVICES

PRIORITY

This is a continuation of U.S. patent application Ser. No. 16/858,440, filed Apr. 24, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology. Recently, multigate devices have been introduced to improve gate control. Multigate devices have been observed to increase gate-channel coupling, reduce OFF-state current, and/or reduce short-channel effects (SCEs). One such multigate device is the gate-all-around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen when fabricating a gate structure for a GAA device that includes an n-metal gate that shares a boundary with a p-metal gate, which challenges have been observed to degrade GAA device performance and increase GAA processing complexity. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, and 17A are fragmentary diagrammatic top views of a multi-gate device, in portion, at various fabrication stages (such as those associated with the method in FIG. 1A and FIG. 1B) according to various aspects of the present disclosure.

FIGS. 2B, 3B, 4B, 5B, 6B, 7B, 8B, 9B, 9B-1, 10B, 10B-1, 11B, 12B, 13B, 14B, 15B, 16B, and 17B are fragmentary diagrammatic cross-sectional views of a multi-gate device, in portion, at various fabrication stages (such as those associated with the method in FIG. 1A and FIG. 1B) according to various aspects of the present disclosure.

FIGS. 2C, 3C, 4C, 5C, 6C, 7C, 8C, 9C, 10C, 11C, 12C, 13C, 14C, 15C, 16C, and 17C are fragmentary diagrammatic cross-sectional views of a multi-gate device, in portion, at various fabrication stages (such as those associated with the method in FIG. 1A and FIG. 1B) according to various aspects of the present disclosure.

FIGS. 2D, 3D, 4D, 5D, 6D, 7D, 8D, 9D, 10D, 11D, 12D, 13D, 14D, 15D, 16D, and 17D are fragmentary diagrammatic cross-sectional views of a multi-gate device, in portion, at various fabrication stages (such as those associated with the method in FIG. 1A and FIG. 1B) according to various aspects of the present disclosure.

DETAILED DESCRIPTION

Figure 1A:
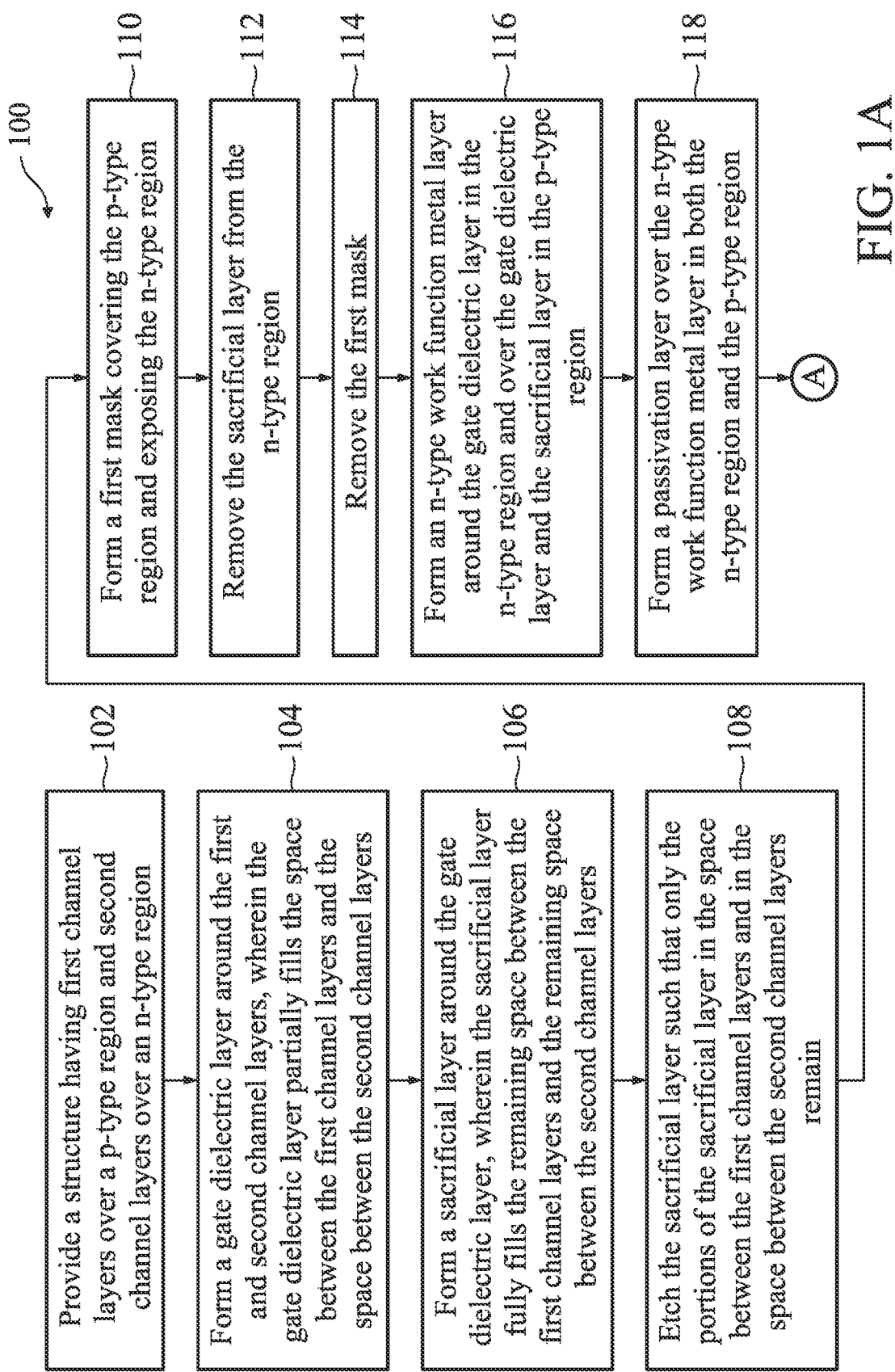
FIG. 1A and FIG. 1B are a flow chart of a method for fabricating a multigate device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10%) of the number described, in accordance with the knowledge of the skilled in the art in view of the specific technology disclosed herein, unless otherwise specified. For example, the term "about 5 nm" may encompass the dimension range from 4.5 nm to 5.5 nm.

The present disclosure relates generally to integrated circuit devices, and more particularly, to multi-gate devices, such as gate-all-around (GAA) devices. More specifically, the present disclosure relates to patterning gate work function (WF) metal layer(s) for GAA devices to provide appropriate threshold voltages ($V_t$) for NMOS and PMOS GAA devices respectively. Providing multiple threshold voltages in a process is desirable for many applications. However, patterning gate WF metal layers (or gate patterning) is quite challenging for GAA devices because of the narrow space between adjacent channel semiconductor layers. Considerations for gate patterning include the variation of $V_t$ caused by metal diffusion between n-type and p-type work function metals and metal residue resulted from patterning processes, among others. An objective of the present disclosure is to provide gate patterning methods that reduce $V_t$ variation and are compatible with existing CMOS process flows.

Figure 1B:
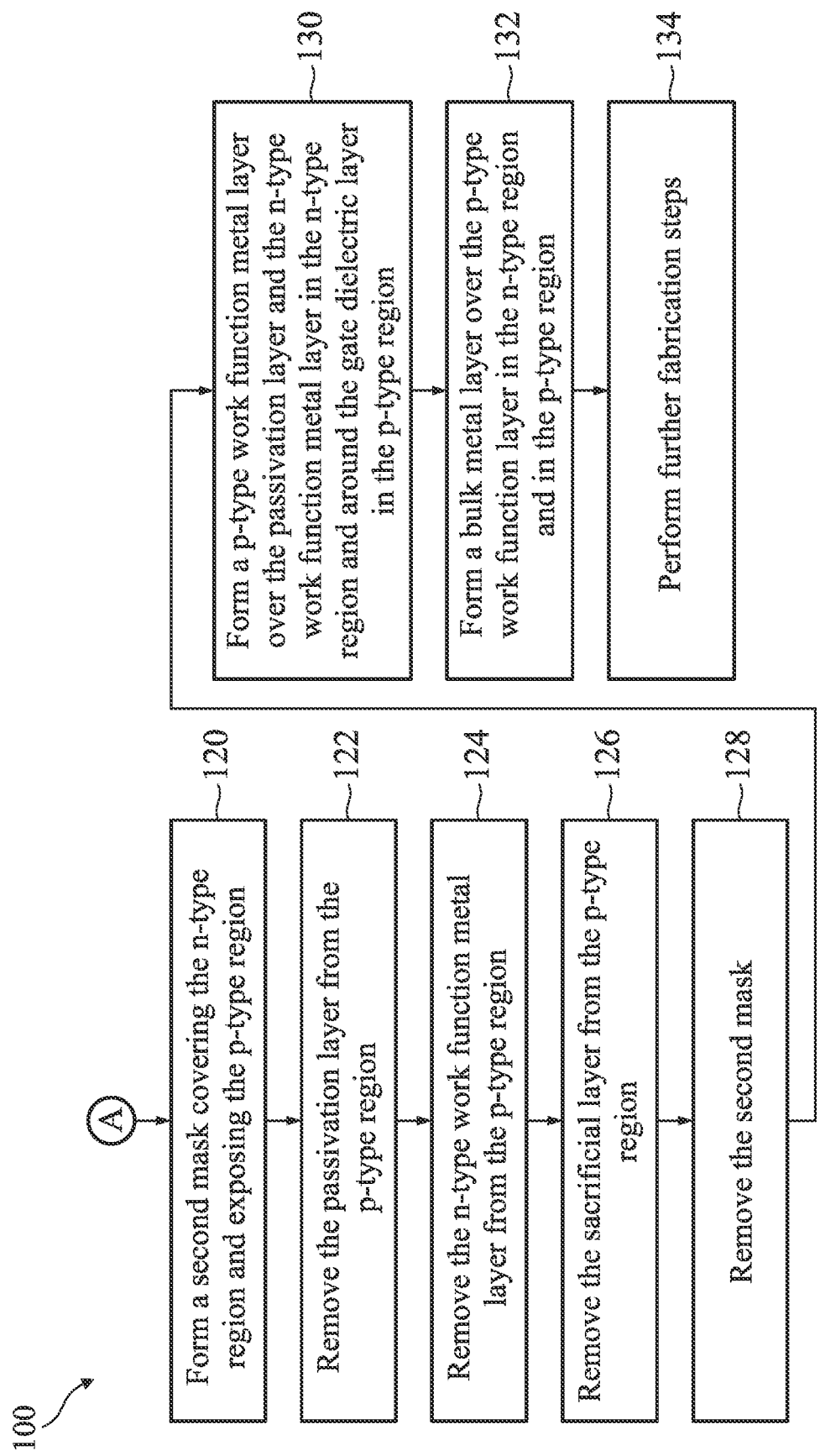
Figures 2A, 2B:
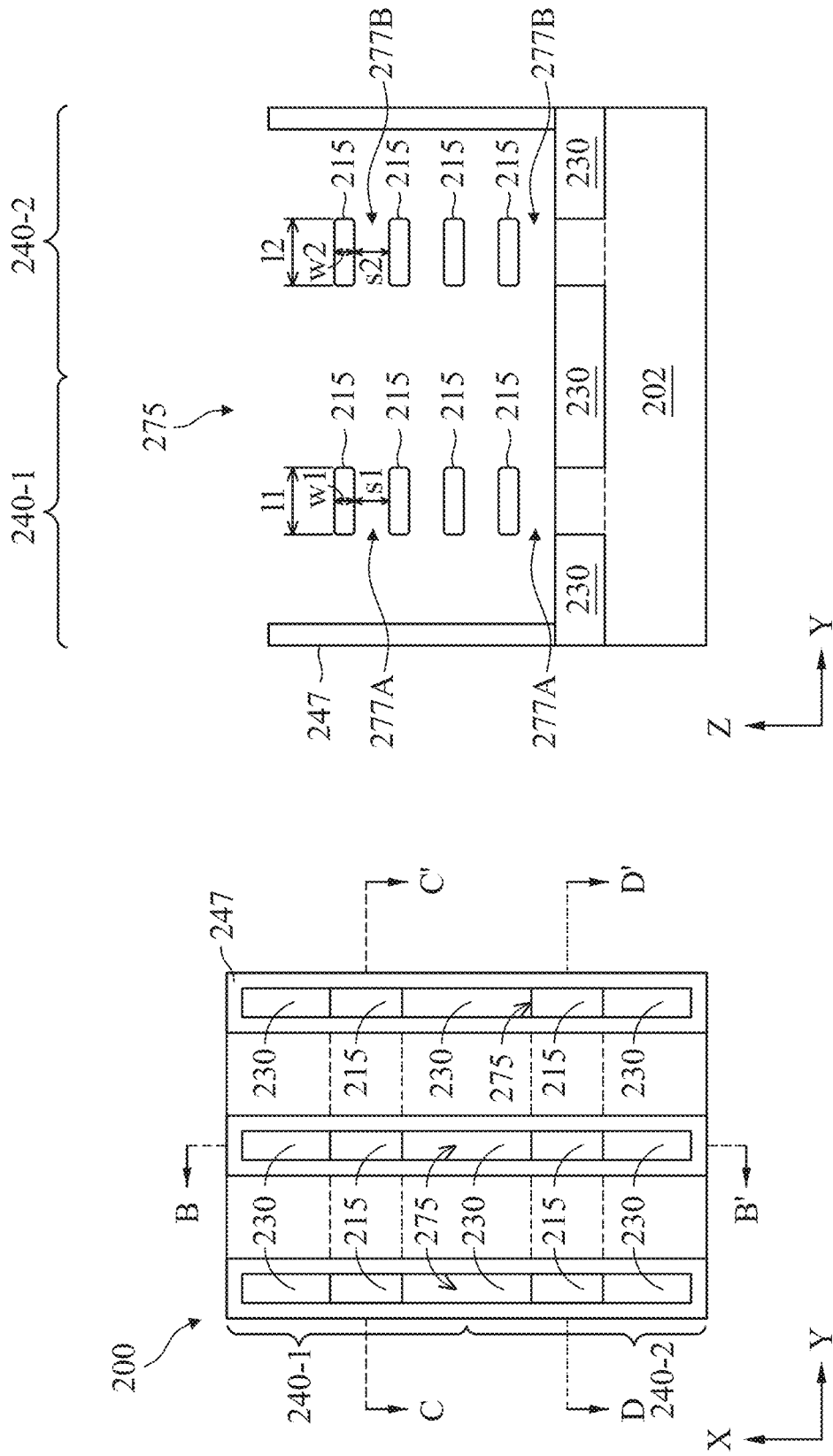
Figure 2C:
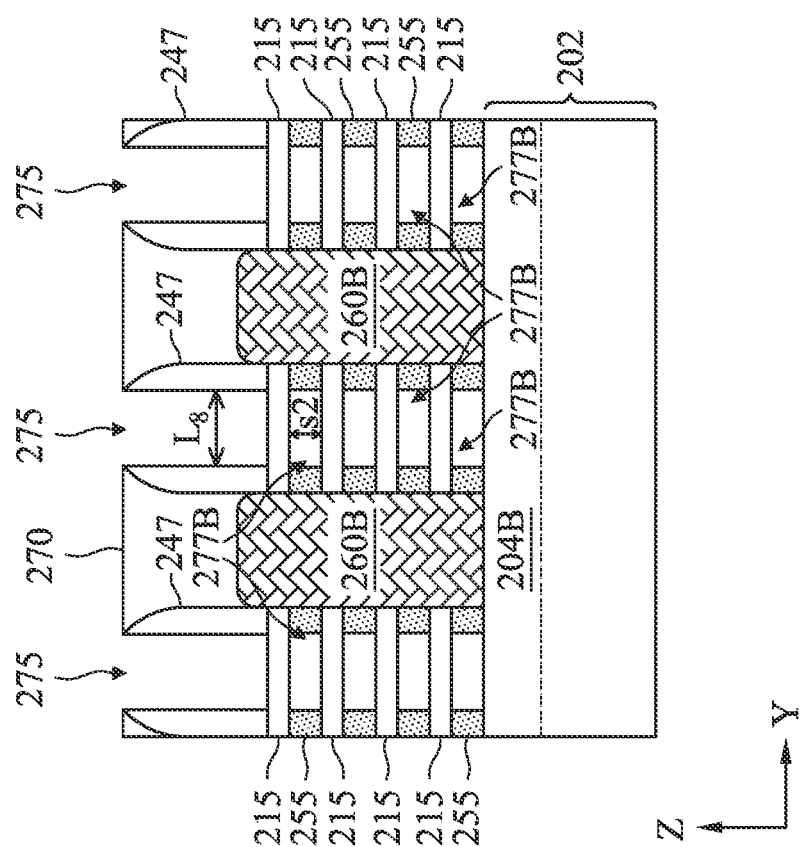
Figure 2D:
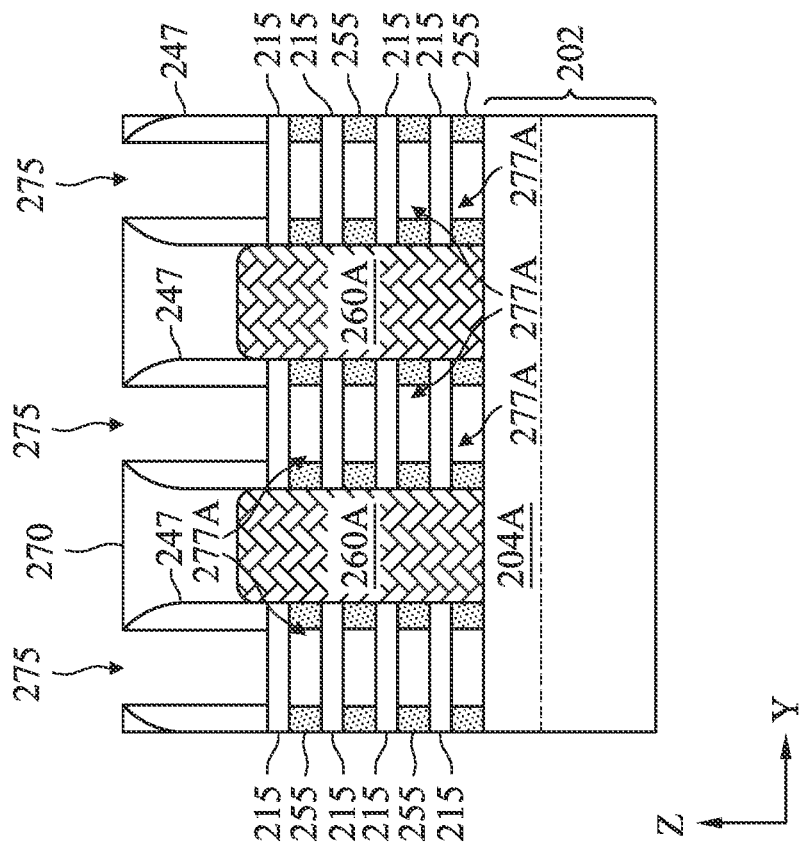
Figure 3C:
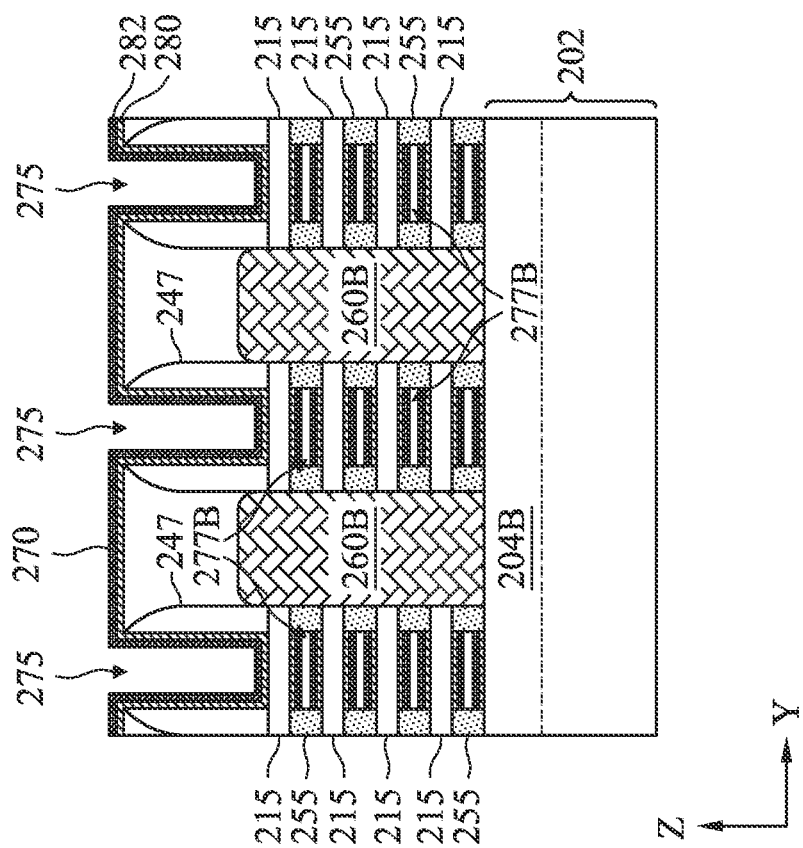
Figure 3D:
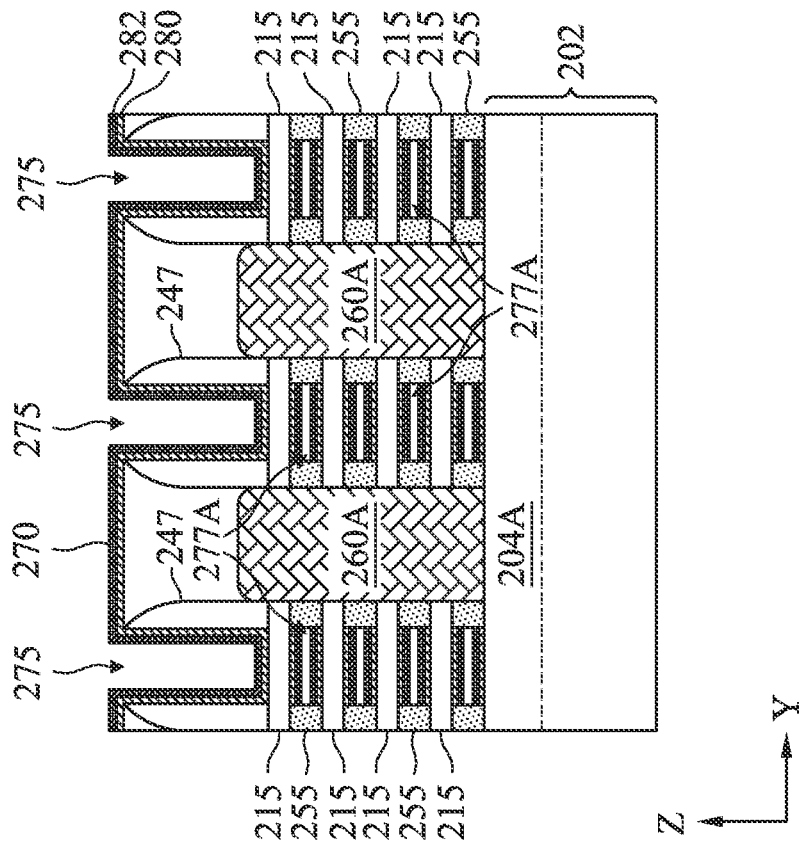
Figures 5A, 5B:
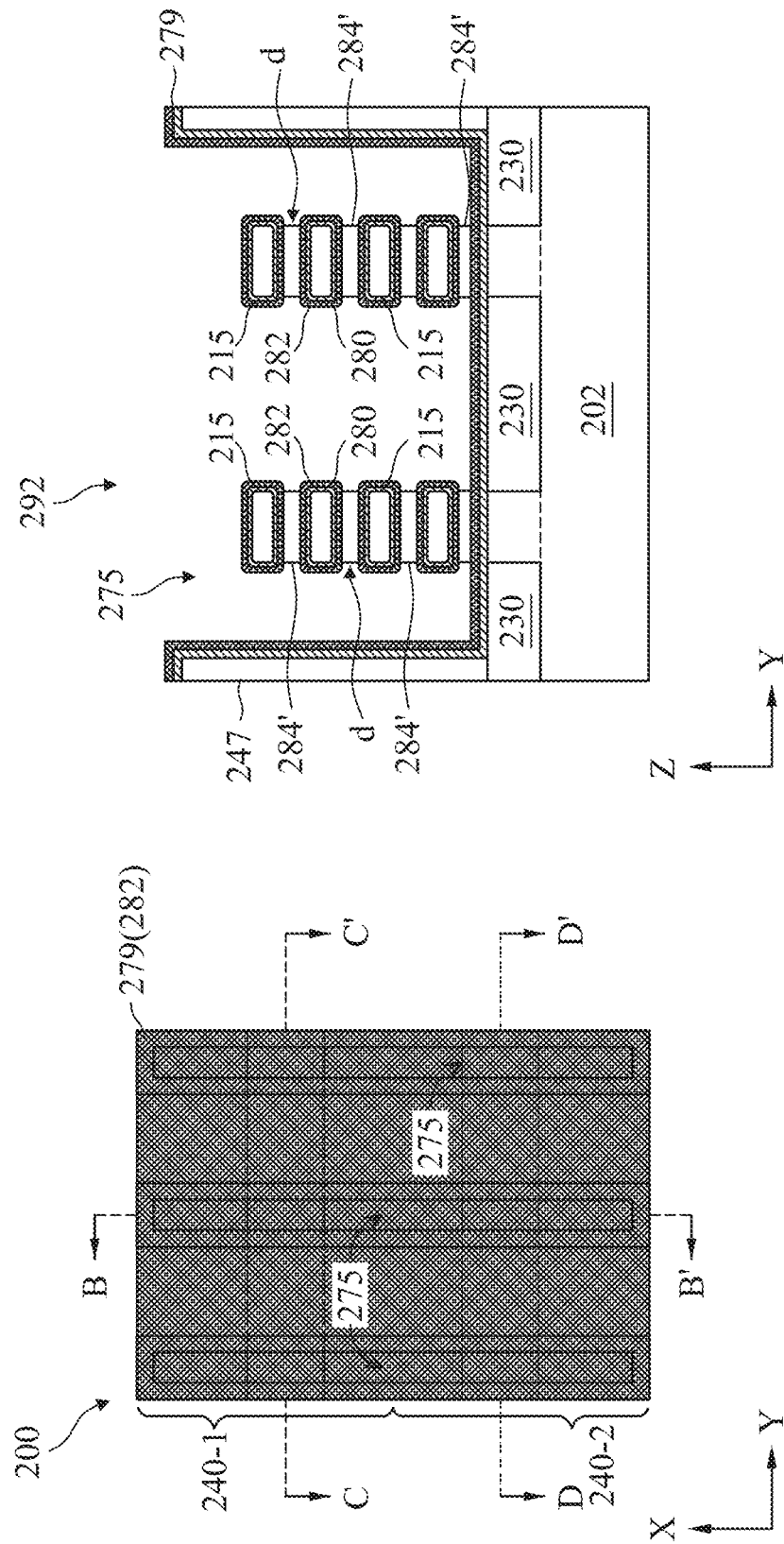
Figures 6A, 6B:
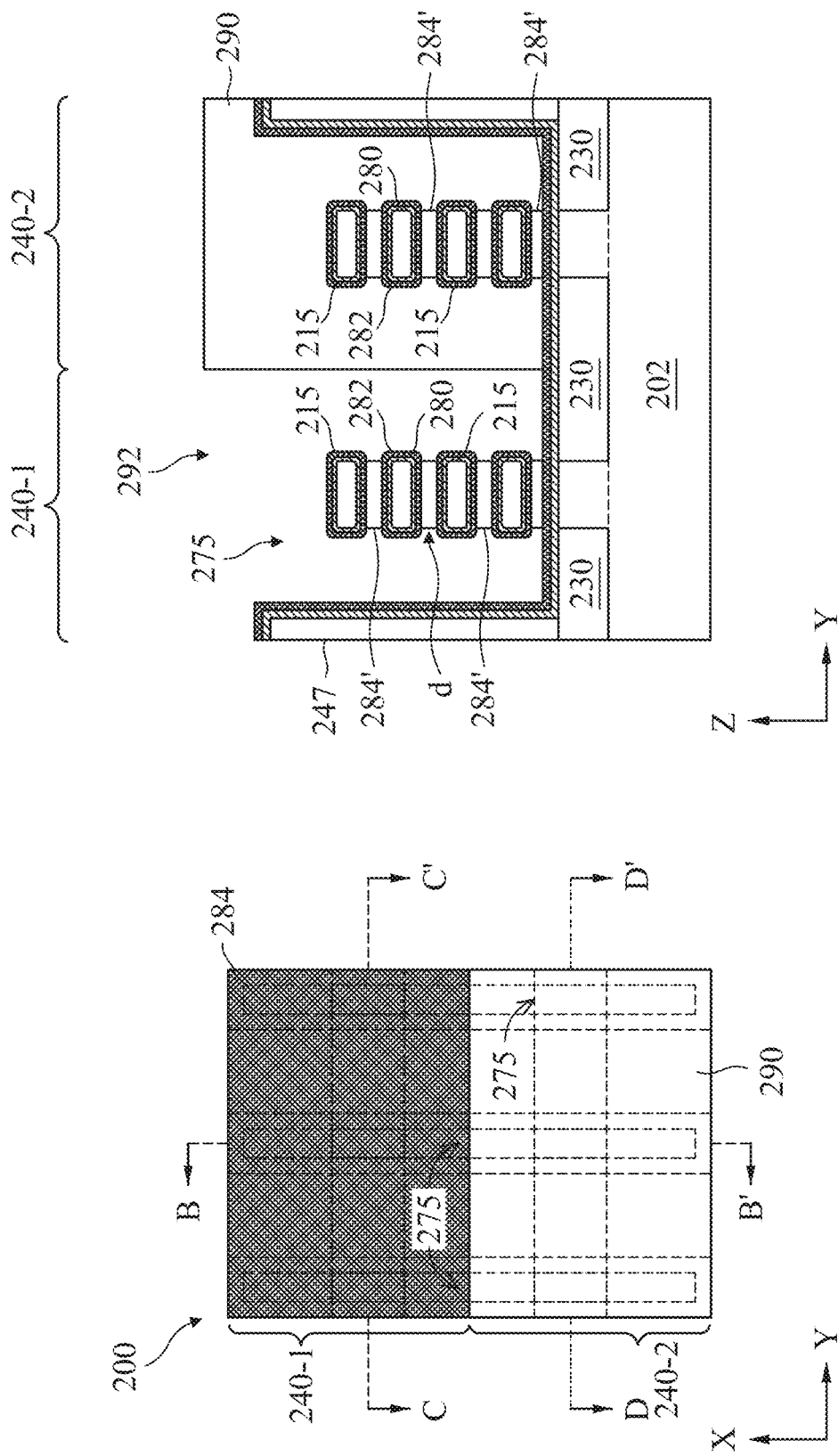
Figure 6C:
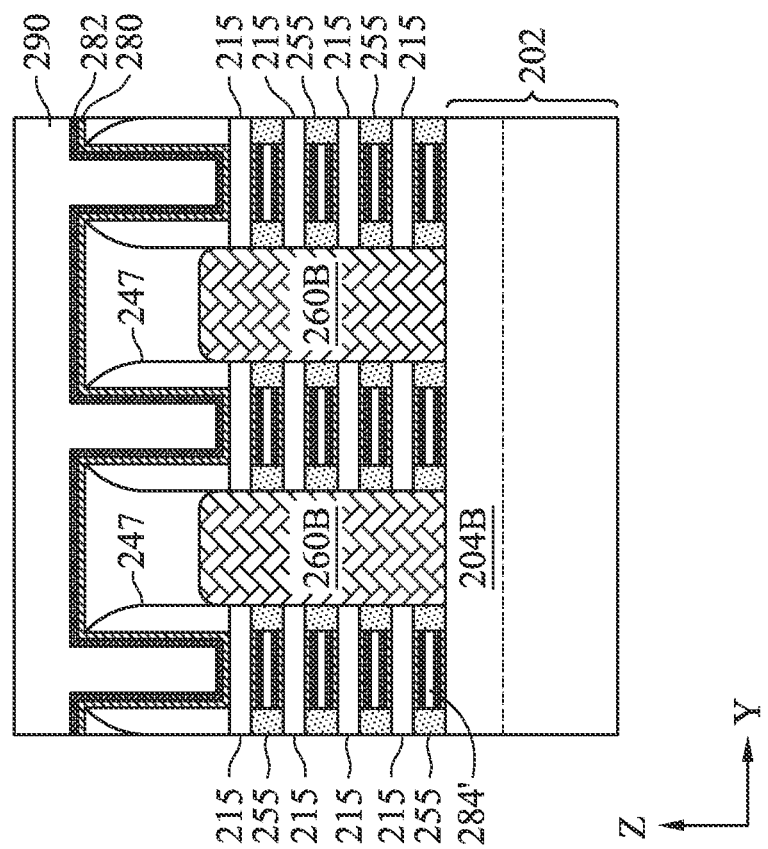
Figure 6D:
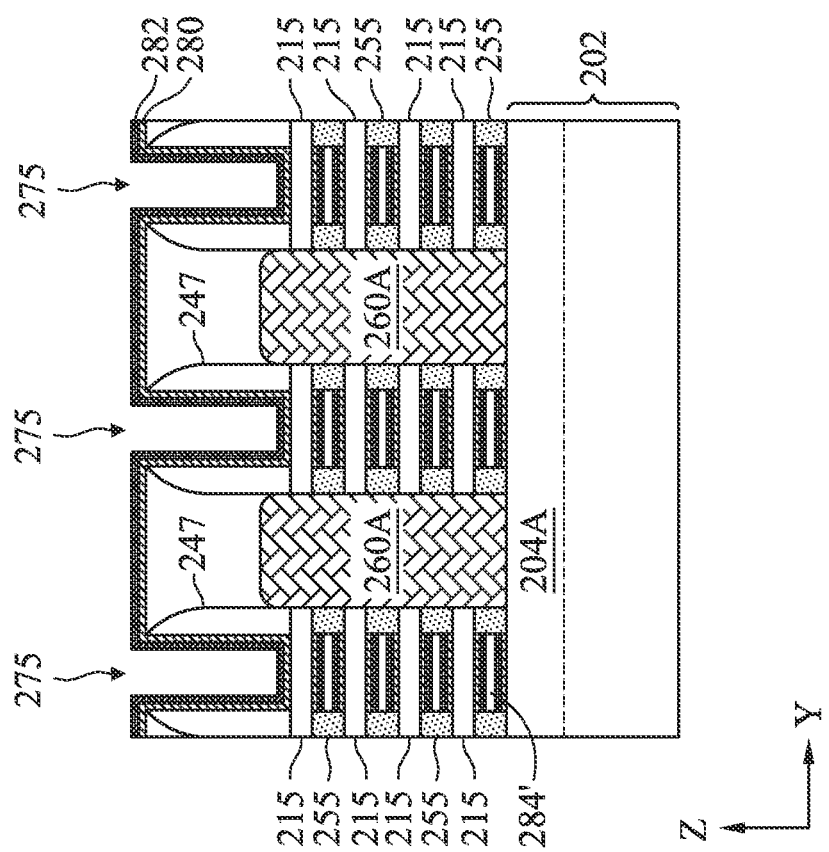
Figures 7A, 7B:
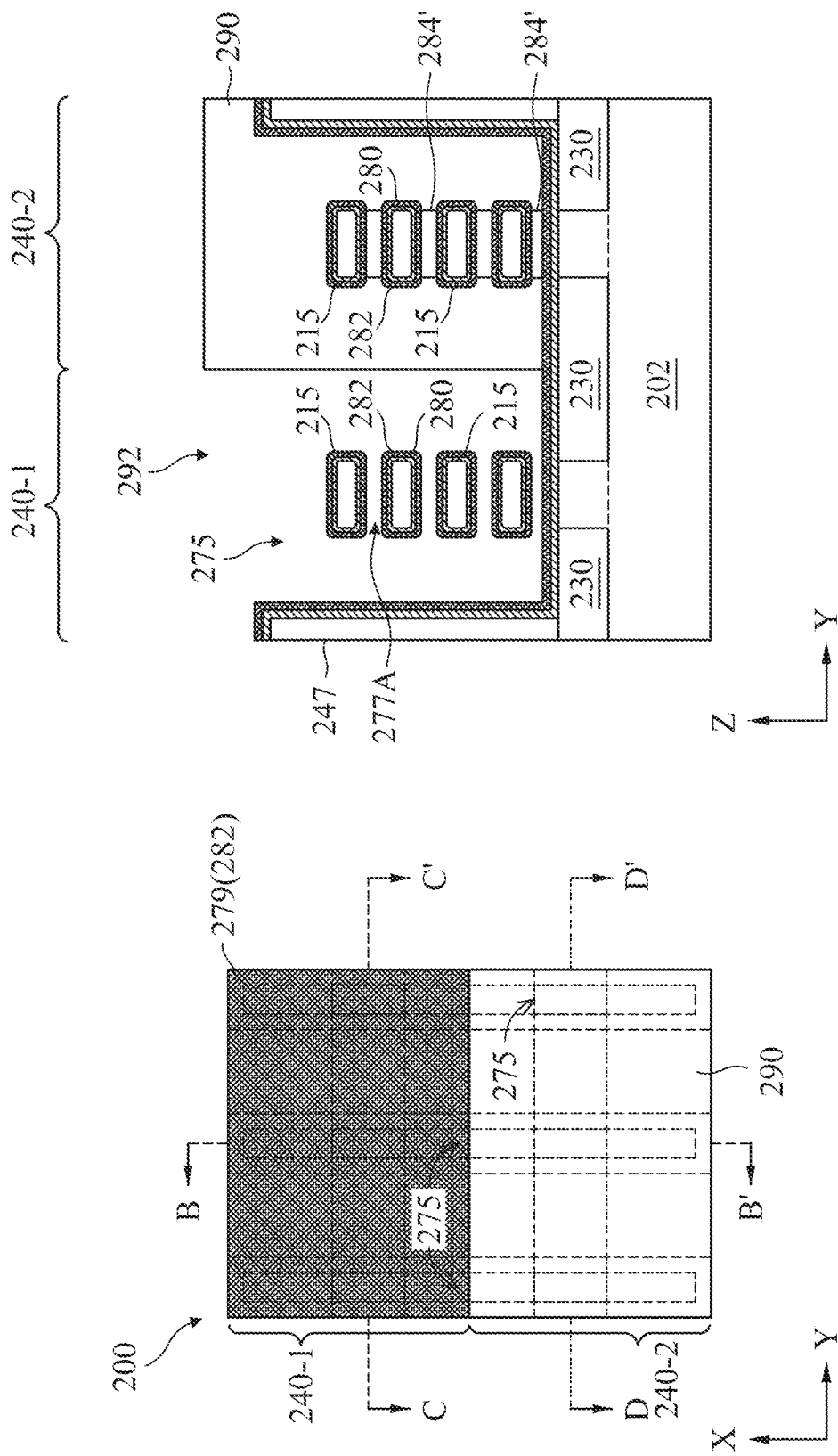
Figures 8A, 8B:
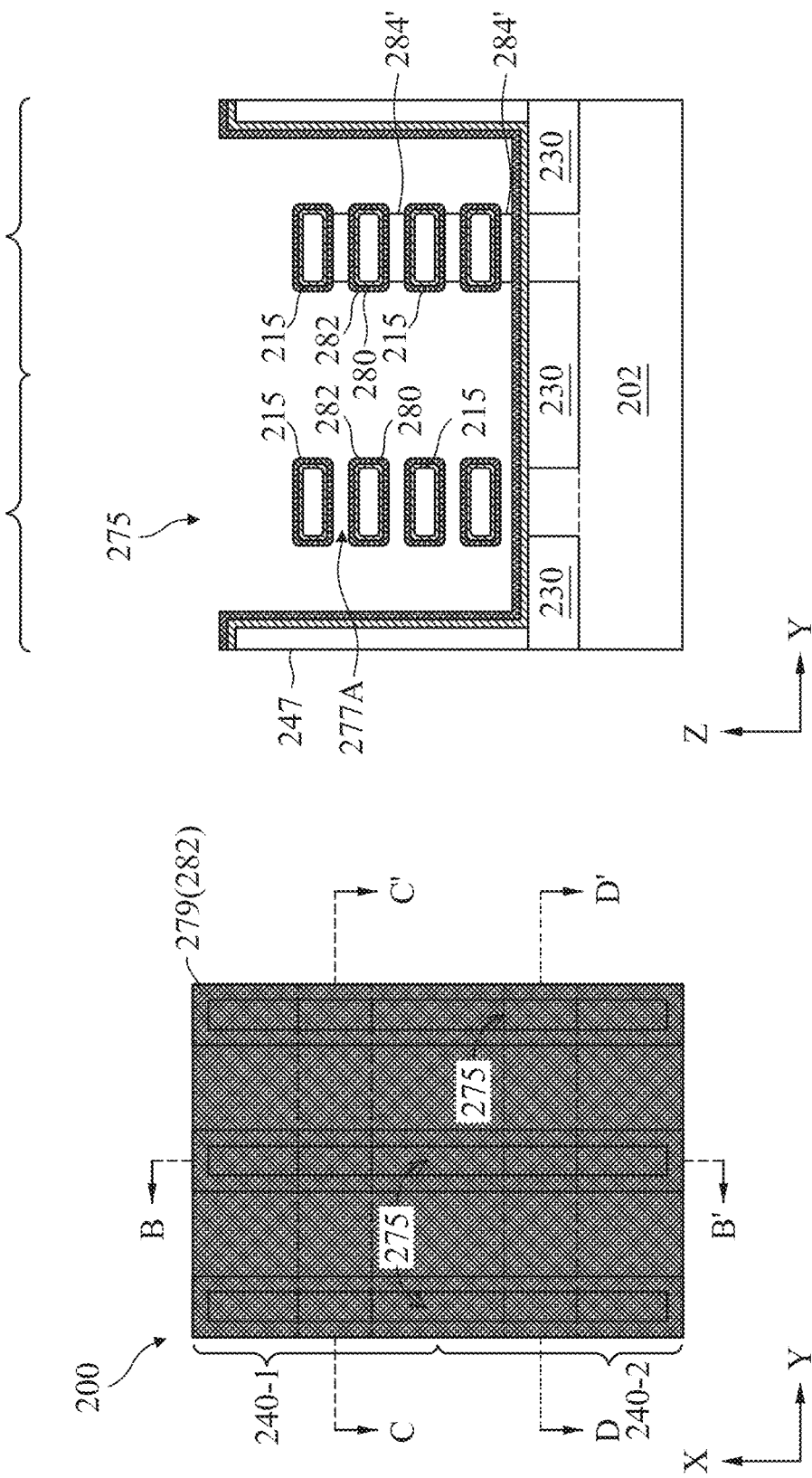

FIG. 1A and FIG. 1B are a flow chart of a method 100 for fabricating a multi-gate device according to various aspects of the present disclosure. In some embodiments, the method 100 fabricates a multi-gate device that includes p-type GAA transistors and n-type GAA transistors. The method 100 is briefly described below.

At operation 102, an initial structure is provided. The initial structure includes first channel semiconductor layers (or first channel layers) suspended between a pair of p-type source/drain (S/D) features in a p-type device region, and second channel semiconductor layers (or second channel layers) suspended between a pair of n-type source/drain (S/D) features in an n-type device region. The first channel layers and the second channel layers are exposed in gate trenches resulted from the removal of dummy gates. At operation 104, a gate dielectric layer is formed in the gate trenches around the first channel layers and around the second channel layers. The gate dielectric layer may include an interfacial layer and a high-k dielectric layer. The gate dielectric layer partially fills the gaps between the adjacent first channel layers and between the adjacent second channel layers. At operation 106, a sacrificial layer is formed over the gate dielectric layer in the gate trenches in both the p-type device region and the n-type device region. The sacrificial layer fully fills any remaining portion of the gaps between the adjacent first channel layers and between the adjacent second channel layers. At operation 108, the sacrificial layer is etched so that it is removed other than the portions of the sacrificial layer in the gaps between the adjacent first channel layers, between the adjacent second channel layers, between the first channel layers and the substrate, and between the second channel layers and the substrate.

At operation 110, a first mask is formed that covers the structure in the p-type device region and exposes the structure in the n-type device region. At operation 112, with the first mask in place, the sacrificial layer is etched and is completely removed from the n-type device region. At operation 114, the first mask is removed.

At operation 116, an n-type work function metal layer is formed in the gate trenches over the gate dielectric layer in both the p-type device region and the n-type device region. The n-type work function metal layer may partially or fully fill the gaps between the adjacent second channel layers and between the second channel layers and the substrate in the n-type device region. In the p-type device region, the sacrificial layer still fills the gaps between the adjacent first channel layers and between the first channel layers and the substrate. At operation 118, a passivation layer is formed over the n-type work function metal layer in both the p-type device region and the n-type device region. The passivation layer is optional. However, having the passivation layer improves $V_t$ uniformity in the n-type GAA transistors. Since this passivation layer is formed directly over the n-type work function metal layer, it is also referred to as NMG passivation.

At operation 120, a second mask is formed that covers the structure in the n-type device region and exposes the structure in the p-type device region. With the second mask in place, operation 122 removes the NMG passivation from the p-type device region, operation 124 removes the n-type work function metal layer from the p-type device region, and operation 126 removes the sacrificial layer from the p-type device region. Then, the second mask is removed at operation 128.

At operation 130, a p-type work function metal layer is formed in the gate trenches over the gate dielectric layer in the p-type device region and over the n-type work function metal layer and the optional NMG passivation in the n-type device region. Another optional passivation layer, PMG passivation, may be formed over the p-type work function metal layer in both the p-type device region and the n-type device region. At operation 132, a bulk metal layer is formed in the gate trenches over the p-type work function layer and the optional PMG passivation in both the n-type device region and the p-type device region. A planarization process may be performed on the bulk metal layer, the optional PMG passivation, the p-type work function layer, the optional NMG passivation, the n-type work function layer, and the gate dielectric layer, thereby forming a p-metal gate in the p-type device region and an n-metal gate in the n-type device region. The method 100 then proceeds to block 134 to perform further steps, such as forming contacts. Embodiments of the method 100 may form the p-metal gate without any residues of the n-type work function layer, thereby improving $V_t$ uniformity in the p-type GAA transistors. Further, embodiments of the method 100 may form the n-metal gate with uniform distribution of the n-type work function layer around each of the second channel layers, thereby improving $V_t$ uniformity in the n-type GAA transistors. Additional processing is contemplated by the present disclosure. Additional steps can be provided before, during, and after the method 100, and some of the steps described can be moved, replaced, or eliminated for additional embodiments of the method 100. The discussion that follows illustrates various embodiments of nanosheet-based integrated circuit devices that can be fabricated according to the method 100.

FIGS. 2A-17A, FIGS. 2B-17B, FIGS. 2C-17C, and FIGS. 2D-17D are fragmentary diagrammatic views of a multi-gate (or multigate) device 200, in portion or entirety, at various fabrication stages (such as those associated with method 100 in FIG. 1A and FIG. 1B) according to various aspects of the present disclosure. In particular, FIGS. 2A-17A are top views of multi-gate device 200 in an X-Y plane; FIGS. 2B-17B are diagrammatic cross-sectional views of multi-gate device 200 in an X-Z plane along lines B-B' respectively of FIGS. 2A-17A, FIGS. 2C-17C are diagrammatic cross-sectional views of multi-gate device 200 in a Y-Z plane along lines C-C' respectively of FIGS. 2A-17A; and FIGS. 2D-17D are diagrammatic cross-sectional views of multi-gate device 200 in the Y-Z plane along lines D-D' respectively of FIGS. 2A-17A.

Multi-gate device 200 may be included in a microprocessor, a memory, and/or other IC device. In some embodiments, multi-gate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multi-gate device 200 is included in a non-volatile memory, such as a non-volatile random access memory (NVRAM), a flash memory, an electrically erasable programmable read only memory (EEPROM), an erasable programmable read-only memory (EPROM), other suitable memory type, or combinations thereof. FIGS. 2A-17A, FIGS. 2B-17B, FIGS. 2C-17C, and FIGS. 2D-17D have been simplified for the sake of clarity to better understand the inventive concepts of the present disclosure. Additional features can be added in multi-gate device 200, and some of the features described below can be replaced, modified, or eliminated in other embodiments of multi-gate device 200. The fabrication of the device 200 is described below in conjunction with embodiments of the method 100.

The method 100 (FIG. 1A) provides an initial structure of the device 200 at the operation 102. Turning to FIGS. 2A-2D, the device 200 includes a substrate (e.g., a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of the device 200. In the depicted embodiment, substrate 202 includes a p-type doped region 204A (e.g., a p-well), which can be configured for n-type GAA transistors, and an n-type doped region 204B (e.g., an n-well), which can be configured for p-type GAA transistors. N-type doped regions, such as n-well 204B, are doped with n-type dopants, such as phosphorus, arsenic, other n-type dopant, or combinations thereof. P-type doped regions, such as p-well 204A, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. The device 200 includes a region 240-1 for forming n-type GAA devices and a region 240-2 for forming p-type GAA devices. Accordingly, the region 240-1 is also referred to as n-type device region 240-1, and the region 240-2 is also referred to as p-type device region 240-2.

The device 200 further includes n-type source/drain features 260A in the n-type device region 240-1 and p-type source/drain features 260B in the p-type device region 240-2. Each of the source/drain features 260A and 260B may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. The source/drain features 260A and 260B are doped with proper n-type dopants and/or p-type dopants. For example, the source/drain features 260A may include silicon and be doped with carbon, phosphorous, arsenic, other n-type dopant, or combinations thereof; and the source/drain features 260B may include silicon germanium or germanium and be doped with boron, other p-type dopant, or combinations thereof.

The device 200 further includes a stack of semiconductor layers 215 suspended between a pair of the source/drain features 260A in the n-type device region 240-1 and another stack of semiconductor layers 215 suspended between a pair of the source/drain features 260B in the p-type device region 240-2. The stack of semiconductor layers 215 in the n-type device region 240-1 serve as the transistor channels for n-type GAA devices and the stack of semiconductor layers 215 in the p-type device region 240-2 serve as the transistor channels for p-type GAA device. Accordingly, the semiconductor layers 215 are also referred to as channel layers 215. The channel layers 215 are exposed in gate trenches 275 which are resulted from the removal of dummy gates therein. The channel layers 215 may include single crystalline silicon. Alternatively, the channel layers 215 may comprise germanium, silicon germanium, or another suitable semiconductor material(s). Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and between the respective source/drain features 260A, 260B.

The channel layers 215 in the n-type device region 240-1 are separated from each other and from the substrate 202 by gaps 277A. The channel layers 215 in the p-type device region 240-2 are separated from each other and from the substrate 202 by gaps 277B. A spacing s1 is defined between channel layers 215 along the z-direction in n-type gate regions 240-1, and a spacing s2 is defined between channel layers 215 along the z-direction in p-type gate regions 240-2. Spacing s1 and spacing s2 correspond with a width of gaps 277A and gaps 277B, respectively. In the depicted embodiment, spacing s1 is about equal to s2, though the present disclosure contemplates embodiments where spacing s1 is different than spacing s2. Further, channel layers 215 in n-type gate regions 240-1 have a length l1 along the x-direction and a width w1 along the y-direction, and channel layers 215 in p-type gate regions 240-2 have a length l2 along the y-direction and a width w2 along the x-direction. In the depicted embodiment, length l1 is about equal to length l2, and width w1 is about equal to width w2, though the present disclosure contemplates embodiments where length l1 is different than length l2 and/or width w1 is different than width w2. In some embodiments, length l1 and/or length l2 is about 10 nm to about 50 nm. In some embodiments, width w1 and/or width w2 is about 4 nm to about 10 nm. In some embodiments, each channel layer 215 has nanometer-sized dimensions and can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In such embodiments, a vertical stack of suspended channel layers can be referred to as a nanostructure. In some embodiments, the channel layers 215 may be cylindrical-shaped (e.g., nanowire), rectangular-shaped (e.g., nanobar), sheet-shaped (e.g., nanosheet), etc.), or have other suitable shapes.

The device 200 further includes isolation feature(s) 230 to isolate various regions, such as various doped regions 204A and 204B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

The device 200 further includes gate spacers 247 adjacent to the source/drain features 260A, 260B. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the source/drain features 260A, 260B. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255.

The device 200 further includes an inter-level dielectric (ILD) layer 270 over the isolation features 230, the epitaxial source/drain features 260A, 260B, and the gate spacers 247. The ILD layer 270 may be formed by a deposition process, such as CVD, flowable CVD (FCVD), or other suitable methods. An FCVD process may include depositing a flowable material (such as a liquid compound) over the device 200 and converting the flowable material to a solid material by thermal annealing and/or ultraviolet radiation treating. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. ILD layer 270 can include a multilayer structure having multiple dielectric materials. In some embodiments, a contact etch stop layer (CESL) (not shown) is disposed between ILD layer 270 and isolation features 230, epitaxial source/drain features 260A, 260B, and gate spacers 247. The CESL includes a dielectric material different than ILD layer 270. For example, where ILD layer 270 includes a low-k dielectric material, the CESL includes silicon and nitrogen, such as silicon nitride or silicon oxynitride.

The method 100 (FIG. 1A) forms a gate dielectric layer 279 around the channel layers 215 at the operation 104. Turning to FIGS. 3A-3D, in the depicted embodiment, the gate dielectric layer 279 includes an interfacial layer 280 over the channel layers 215 and a high-k dielectric layer 282 over the interfacial layer 280. In furtherance of the depicted embodiment, interfacial layer 280 and high-k dielectric layer 282 partially fill gaps 277A and partially fill gaps 277B. In some embodiments, interfacial layer 280 and/or high-k dielectric layer 282 are also disposed on substrate 202, isolation features 230, and/or gate spacers 247. Interfacial layer 280 includes a dielectric material, such as $SiO_2$, HfSiO, SiON, other silicon-containing dielectric material, other suitable dielectric material, or combinations thereof. High-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$(BTO), (Ba,Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer 280 is formed by any of the processes described herein, such as thermal oxidation, chemical oxidation, ALD, CVD, other suitable process, or combinations thereof. In some embodiments, interfacial layer 280 has a thickness of about 0.5 nm to about 3 nm. High-k dielectric layer 282 is formed by any of the processes described herein, such as ALD, CVD, PVD, oxidation-based deposition process, other suitable process, or combinations thereof. In some embodiments, high-k dielectric layer 282 has a thickness of about 1 nm to about 2 nm. In alternative embodiments, the gate dielectric layer 279 may include additional dielectric layers or may omit the interfacial layer 280.

The method 100 (FIG. 1A) forms a sacrificial layer (or a dummy hard mask) 284 over the gate dielectric layer 279 at the operation 106. Turning to FIGS. 4A-4D, in the depicted embodiment, the sacrificial layer 284 partially fills gate trenches 275 and wraps around (surrounds) channel layers 215 in both the n-type device region 240-1 and the p-type device region 240-2. The sacrificial layer 284 may be deposited on the gate dielectric layer 279 by any of the processes described herein, such as ALD, CVD, PVD, other suitable process, or combinations thereof. A thickness of the sacrificial layer 284 is configured to fill any remaining portion of the gaps 277A between the adjacent channel layers 215 in the n-type device region 240-1 and any remaining portion of the gaps 277B between the adjacent channel layers 215 in the p-type device region 240-2 without filling the gate trenches 275 (i.e., any portions of the gaps 277A, 277B not filled by the gate dielectric layer 279). In some embodiments, the thickness of sacrificial layer 284 is about 0.5 nm to about 5 nm.

The sacrificial layer 284 includes a material that is different than a high-k dielectric material to achieve etching selectivity between sacrificial layer 284 and high-k dielectric layer 282 during an etching process, such that sacrificial layer 284 can be selectively etched with minimal (to no) etching of high-k dielectric layer 282. The material of sacrificial layer 284 is also different than a material of an n-type work function metal layer (such as the n-type work function metal layer 340 in FIG. 9B) to achieve etching selectivity between sacrificial layer 284 and the n-type work function layer during an etching process, such that sacrificial layer 284 can be selectively etched with minimal (to no) etching of the n-type work function layer, and vice versa. In some embodiments, the material of sacrificial layer 284 is also different than a material of a passivation layer over an n-type work function metal layer (such as the passivation layer 342 over the n-type work function metal layer 340 in FIGS. 10B) to achieve etching selectivity between sacrificial layer 284 and the passivation layer during an etching process, such that sacrificial layer 284 can be selectively etched with minimal (to no) etching of the passivation layer, and vice versa. The material of sacrificial layer 284 may also be different than a low-k dielectric material to achieve etching selectivity between sacrificial layer 284 and low-k dielectric material, such as that of ILD layer 270, during an etching process, such that sacrificial layer 284 can be selectively etched with minimal (to no) etching of ILD layer 270. Further, the material of sacrificial layer 284 is designed to be easily etched by a wet etchant. In some embodiments, sacrificial layer 284 includes metal and oxygen (and can thus be referred to as a metal oxide layer), such as aluminum and oxygen (e.g., $AlO_x$, or alumina ($Al_2O_3$)). In some embodiments, sacrificial layer 284 includes titanium nitride (TiN) or silicon oxycarbide (SiOC). The present disclosure contemplates sacrificial layer 284 including other semiconductor materials and/or other dielectric materials that can provide the desired etching selectivity as described herein.

The method 100 (FIG. 1A) etches and partially removes the sacrificial layer 284 at the operation 108. Turning to FIGS. 5A-5D, the sacrificial layer 284 is partially removed and the remaining portions of the sacrificial layer 284 become sacrificial (dummy) features 284' between the channel layers 215 and between the channel layers 215 and the substrate 202 in both the n-type device region 240-1 and the p-type device region 240-2. For the sake of convenience, the sacrificial (dummy) features 284' are sometimes referred to as sacrificial (dummy) layer 284. In some embodiments, the etching process is a wet etching process that uses an etching solution having a high etching selectivity with respect to sacrificial layer 284 relative to high-k dielectric layer 282. In some embodiments, the etching solution exhibits an etching selectivity (i.e., a ratio of an etch rate of sacrificial layer 284 to the etching solution to an etch rate of high-k dielectric layer 282 to the etching solution) of about 10 to about 100. In some embodiments, the etching selectivity is greater than or equal to 100.

In some embodiments, the wet etching process in the operation 108 implements an $NH_4OH$-based wet etching solution. In some embodiments, the wet etching process in the operation 108 implements a digital etch process that includes a self-limited oxidation followed by an oxide removal process. For example, the self-limited oxidation may be implemented with HPM (a mixture of HCl, $H_2O_2$, and $H_2O$), $H_2O_2$, or ozonated de-ionized (DI) water (DI-$O_3$); and the oxide removal process may use HCl, $NH_4OH$, diluted HF, or other suitable chemicals. Parameters of the etching process (such as etching temperature, etching solution concentration, etching time, other suitable wet etching parameters, or combinations thereof) are controlled (tuned) to remove sacrificial layer 284 from sidewalls of channel layers 215 and from over isolation features 230 with minimal (to no) etching of high-k dielectric layer 282. For example, an etching time (i.e., how long sacrificial layer 284 is exposed to the ammonia-based wet etching solution) is tuned to remove sacrificial layer 284 along sidewalls of channel layers 215 and along a topmost portion of high-k dielectric layer 282 (i.e., a portion of high-k dielectric layer 282 that is disposed over a top surface of a topmost channel layer 215). In furtherance of the example, the etching time is further tuned to achieve lateral etching (e.g., along the x-direction and/or the y-direction) of sacrificial layer 284 until a width of the sacrificial features 284' (here, along the x-direction) is less than a sum of the width of channel layers 215 and a thickness of the gate dielectric (here, a sum of the thickness of interfacial layer 280 and the thickness of high-k dielectric layer 282). In some embodiments, a width of sacrificial features 284' is substantially equal to a width of channel layers 215. Sidewalls of sacrificial features 284' are thus recessed a distance d along the x-direction relative to sidewalls of high-k dielectric layer 282. In some embodiments, distance d is greater than 0, for example, about 0.5 nm to about 5 nm. In some embodiments, sidewalls are not recessed along the x-direction relative to sidewalls of high-k dielectric layer 282, such that distance d is equal to 0.

The method 100 (FIG. 1A) then proceeds to the operations 110, 112, and 114 to completely remove the sacrificial layer 284 (i.e., the sacrificial features 284') from the n-type device region 240-1 while keeping the sacrificial features 284' in the p-type device region 240-2.

Turning to FIGS. 6A-6D, at the operation 110, the method 100 (FIG. 1A) forms a mask (or an etch mask) 290 having one or more openings 292. The mask 290 covers p-type GAA transistor regions including the p-type device region 240-2 and exposes n-type GAA transistor regions including the n-type device region 240-1 through the openings 292. The mask 290 includes a material that is different than a material of the sacrificial features 284' to achieve etching selectivity during the removal of the sacrificial features 284'. For example, the mask 290 may include a resist material (and thus may be referred to as a patterned resist layer and/or a patterned photoresist layer). In some embodiments, the mask 290 has a multi-layer structure, such as a resist layer disposed over an anti-reflective coating (ARC) layer. The present disclosure contemplates other materials for the mask 290, so long as etching selectivity is achieved during the removal of the sacrificial features 284'. In some embodiments, the operation 110 includes a lithography process that includes forming a resist layer over the device 200 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 290) includes a resist pattern that corresponds with the photomask, where the patterned resist layer covers p-type GAA transistor regions including the p-type device region 240-2 and exposes n-type GAA transistor regions including the n-type device region 240-1. Alternatively, the exposure process can be implemented or replaced by other methods, such as maskless lithography, e-beam writing, ion-beam writing, or combinations thereof.

Turning to FIGS. 7A-7D, at the operation 112, the method 100 (FIG. 1A) etches the sacrificial features 284' in the n-type device region 240-1 through the openings 292 of the mask 290. The sacrificial features 284' in the p-type device region 240-2 are protected by the mask 290 from the etching process. The etching process completely removes the sacrificial features 284' between the channel layers 215 and between the channel layers 215 and the substrate 202 in the n-type device region 240-1, thereby exposing the gate dielectric layer 279 (which includes the high-k dielectric layer 282) in the n-type device region 240-1. The etching process essentially re-claims or re-forms a portion of gaps 277A in the n-type device region 240-1. In some embodiments, the etching process is a wet etching process that uses an etching solution having a high etching selectivity with respect to the sacrificial features 284' relative to the high-k dielectric layer 282. In some embodiments, the etching solution exhibits an etching selectivity of about 10 to about 100. In some embodiments, the etching selectivity is greater than or equal to 100. In some embodiments, the wet etching process implements an $NH_4OH$-based wet etching solution. Parameters of the etching process (such as etching temperature, etching solution concentration, etching time, other suitable wet etching parameters, or combinations thereof) are controlled to ensure complete removal of the sacrificial features 284' in the n-type device regions 240-1. For example, an etching time (i.e., how long the sacrificial features 284' are exposed to the ammonia-based wet etching solution) is tuned to completely remove the sacrificial features 284' with minimal (to no) etching of high-k dielectric layer 282. In some embodiments, the etching solution further has an etching selectivity with respect to sacrificial features 284' relative to the mask 290. In some embodiments, the etching process partially etches the mask 290.

After the etching process, the mask 290 is removed, for example, by a resist stripping process or other suitable process at the operation 114 of the method 100 (FIG. 1A). Turning to FIGS. 8A-8D, the sacrificial features 284' still remain between the channel layers 215 and between the channel layers 215 and the substrate 202 in the p-type device region 240-2 and is free from the n-type device region 240-1.

Figure 9B:
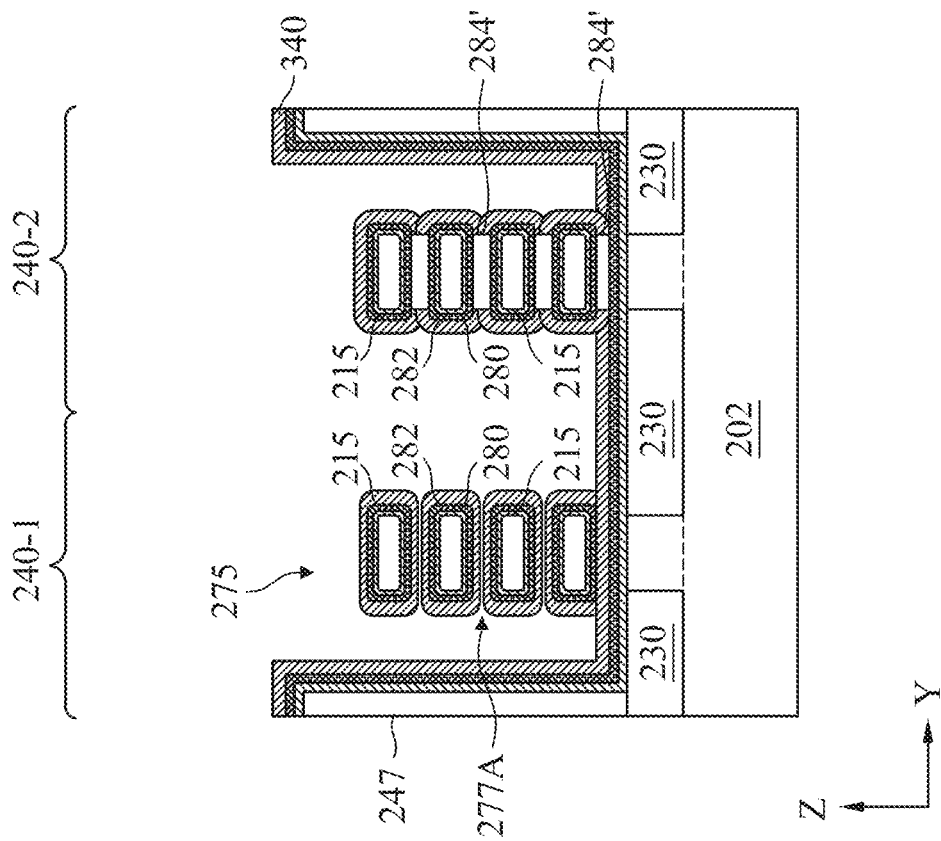
Figure 9A:
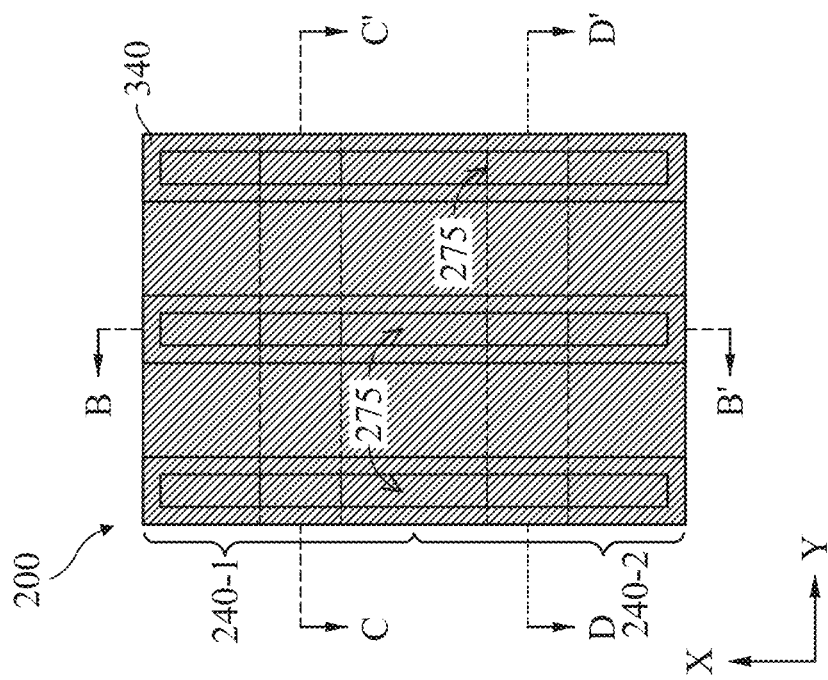
Figures 9C, 9D:
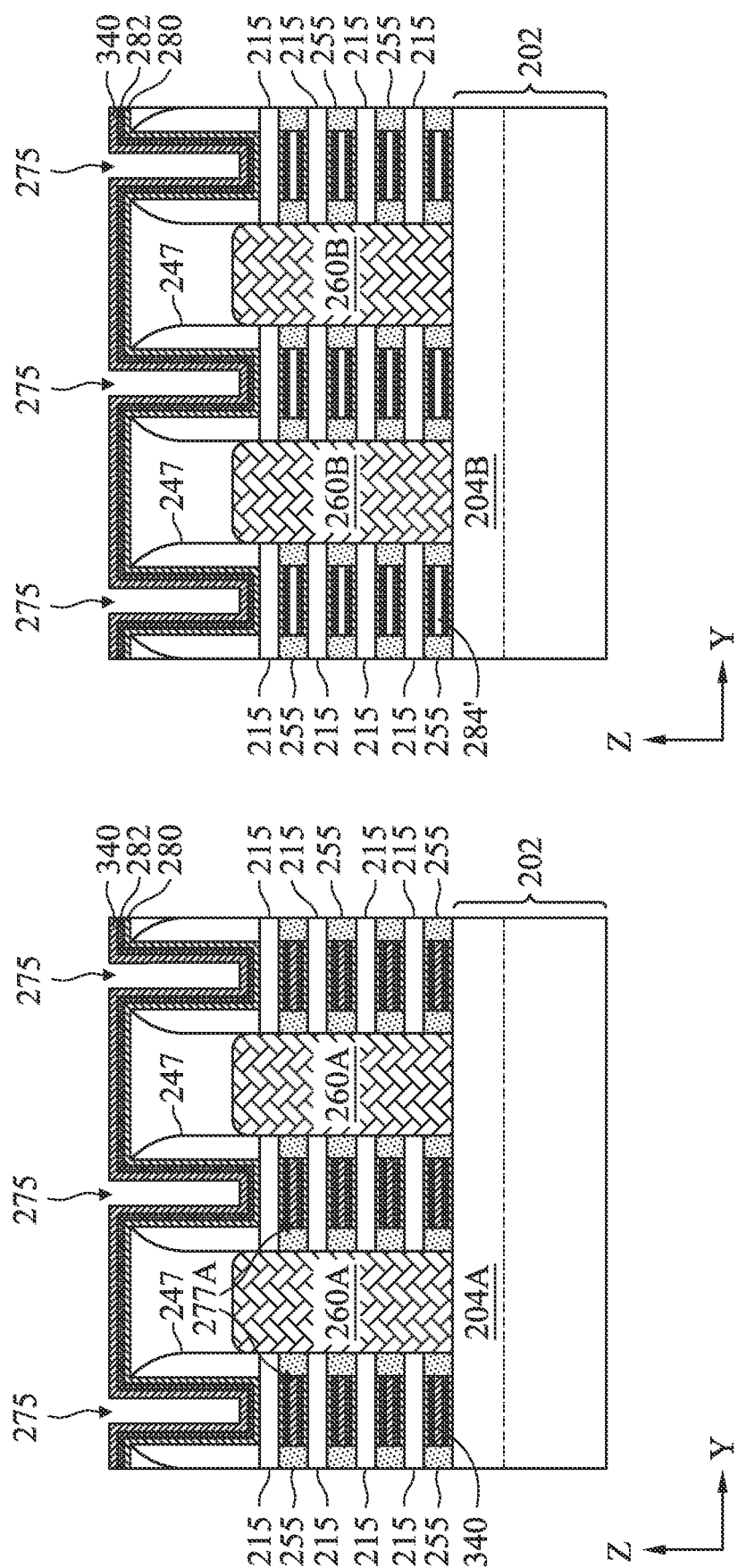

Turning to FIGS. 9A-9D, at the operation 116, the method 100 (FIG. 1A) forms an n-type work function metal layer 340 over the gate dielectric layer 279 (including layers 280 and 282 in this embodiment) and over the sacrificial features 284'. Particularly, the n-type work function metal layer 340 wraps around (surrounds) each of the channel layers 215 in the n-type device region 240-1. In the p-type device region 240-2, because of the sacrificial features 284', the n-type work function metal layer 340 does not wrap around any of the channel layers 215. Further, in the depicted embodiment in FIG. 9B and 9C, the thickness of the n-type work function metal layer 340 is designed such that it does not fully fill the gaps 277A between the adjacent channel layers 215 and between the channel layer 215 and the substrate 202 in the n-type device region 240-1. This allows each of the channel layer 215 in the n-type device region 240-1 to be surrounded by the same thickness of the n-type work function metal layer 340, thereby improving the uniformity of the $V_t$ among the channel layers 215. In an alternative embodiment as depicted in FIG. 9B-1, the thickness of the n-type work function metal layer 340 is designed such that it fully fills the gaps 277A between the adjacent channel layers 215 and between the channel layer 215 and the substrate 202 in the n-type device region 240-1. In some embodiments, the n-type work function metal layer 340 has a thickness of about 1 nm to about 5 nm, such as about 2 nm to about 4 nm. The n-type work function metal layer 340 includes any suitable n-type work function material, such as Ti, Al, Ag, Mn, Zr, TiC, TiAl, TiAlC, TiAl SiC, TaC, TaCN, TaSiN, TaAl, TaAlC, TaSiAlC, TiAlN, other n-type work function material, or combinations thereof. In the depicted embodiment, the n-type work function metal layer 340 includes aluminum. For example, the n-type work function metal layer 340 includes TiAl, TiAlC, TaAlC, TiSiAlC, or a bi-layer of TiAlC and TiN. The n-type work function metal layer 340 may be formed using another suitable deposition process, such as CVD, PVD, ALD, other deposition process, or combinations thereof.

Turning to FIGS. 10A-10D, at the operation 118, the method 100 (FIG. 1A) forms a passivation layer 342 over the n-type work function metal layer 340. Particularly, in the embodiment depicted in FIG. 10B, the passivation layer 342 wraps around (surrounds) each of the channel layers 215 and fills the remaining space in the gaps 277A between the adjacent channel layers 215 and between the channel layers 215 and the substrate 202 in the n-type device region 240-1. The material of the passivation layer 342 is selected to protect the n-type work function metal layer 340, for example, by preventing the diffusion of materials into the n-type work function metal layer 340. Further, it also prevents the materials (particularly aluminum) from the n-type work function metal layer 340 to diffuse out. This stabilizes the n-type work function metal layer 340 and ensures the $V_t$ uniformity among the channel layers 215 in the n-type device region 240-1. Still further, the material of the passivation layer 342 has high etch selectivity with respect to the sacrificial features 284' as discussed earlier. In some embodiments, the passivation layer 342 includes a semiconductor material, a dielectric material, a bi-layer of a semiconductor material and a dielectric material, or other suitable material. For example, the passivation layer 342 may include a layer of silicon (such as polysilicon or amorphous silicon), a layer of silicon dioxide, a bi-layer having a layer of silicon and a layer of silicon dioxide, a layer of alumina, or other suitable materials. The passivation layer 342 is deposited to have a substantially uniform thickness on sidewalls of the gate trenches 275 and over the n-type work function metal layer 340. The passivation layer 342 may have a thickness of about 1 nm to 2 nm. In an embodiment, the passivation layer 342 and the n-type work function metal layer 340 are formed in-situ (i.e., in the same process chamber or in the same cluster tool).

Figures 10A, 10B:
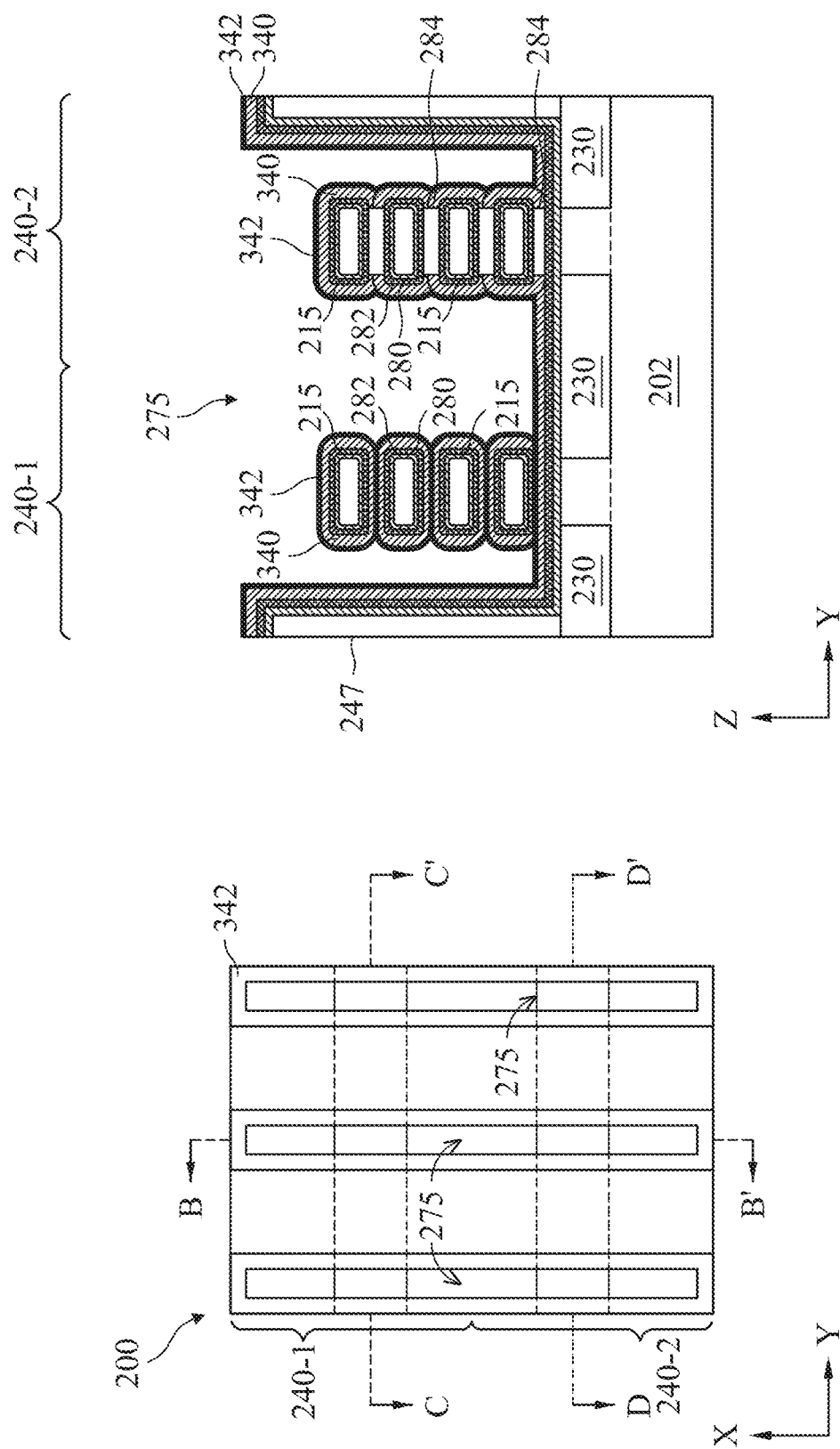
Figure 11B:
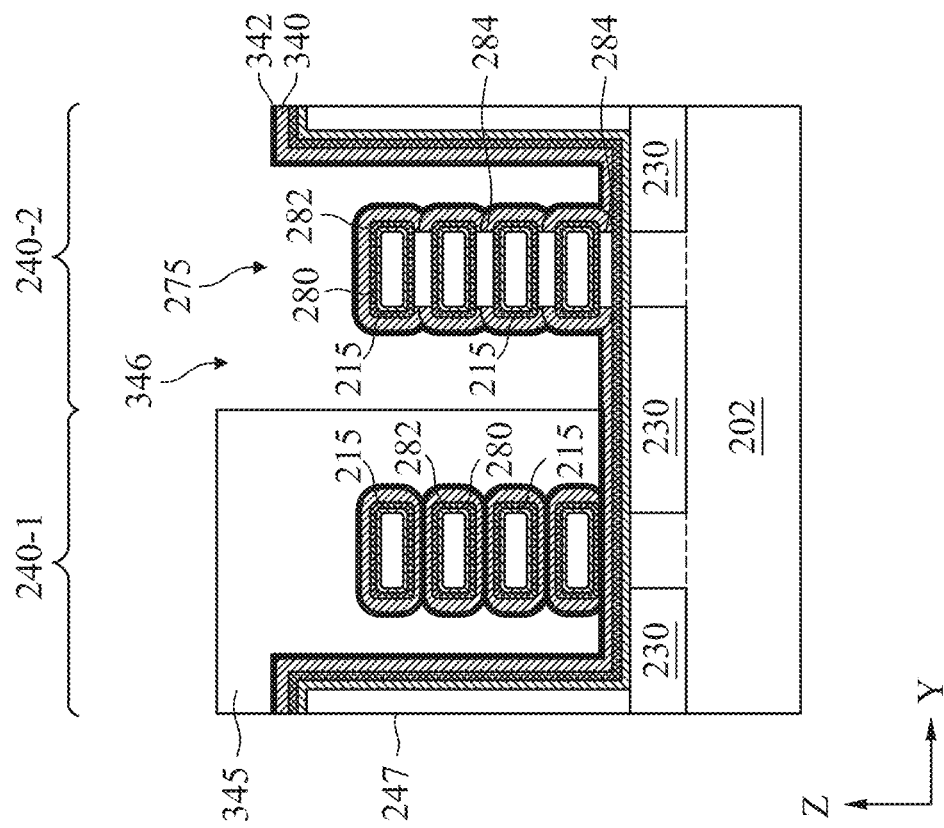
Figure 11A:
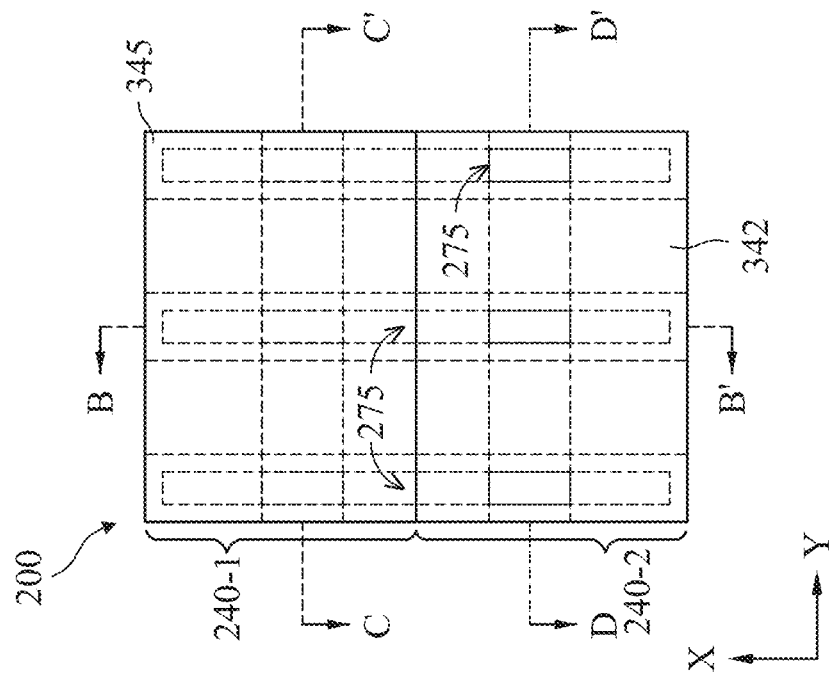
Figure 11C:
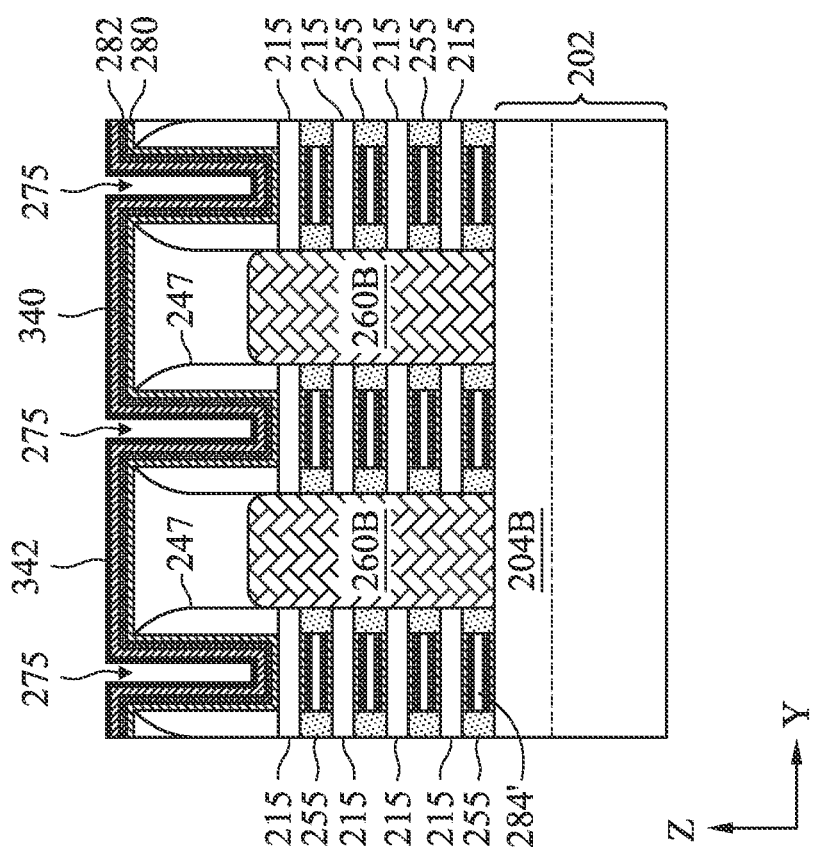
Figure 11D:
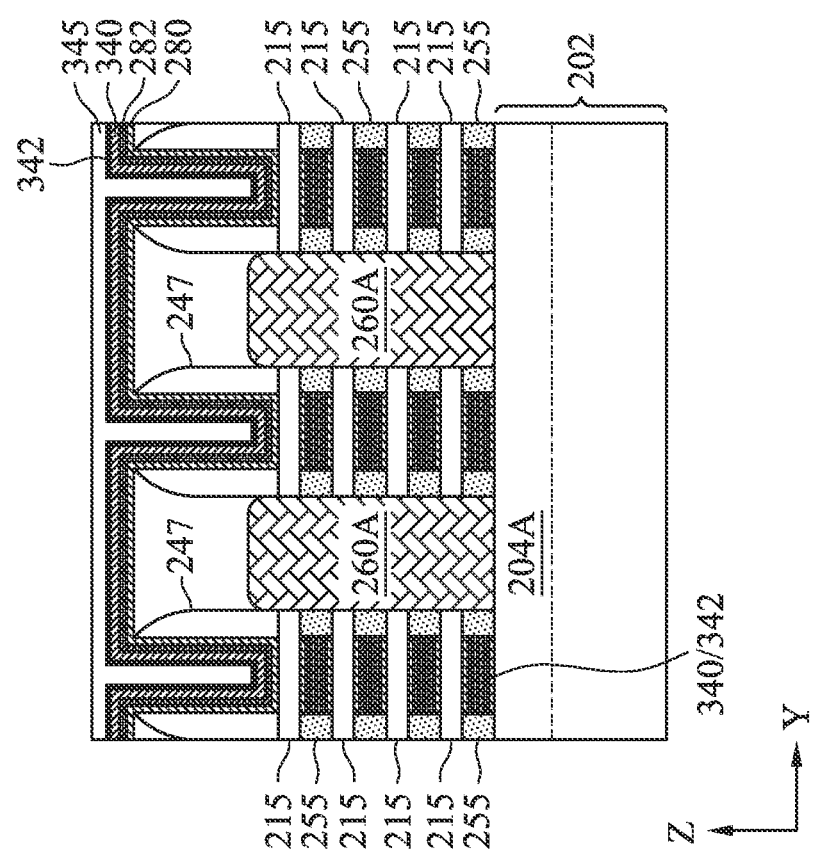
Figure 12B:
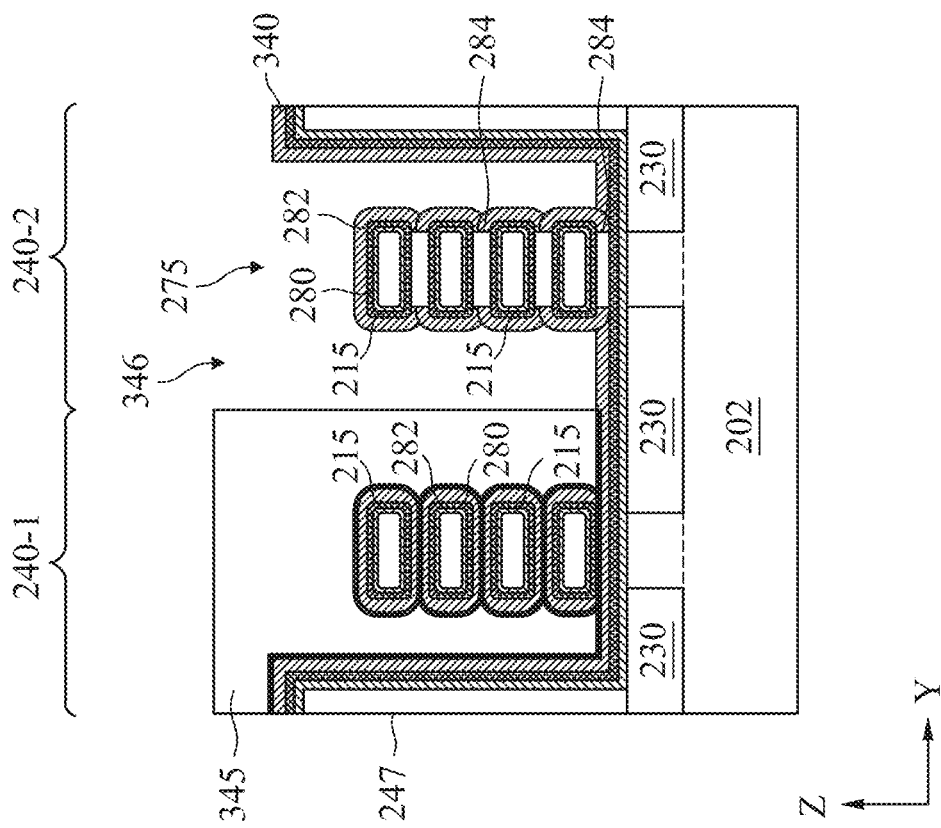
Figure 12A:
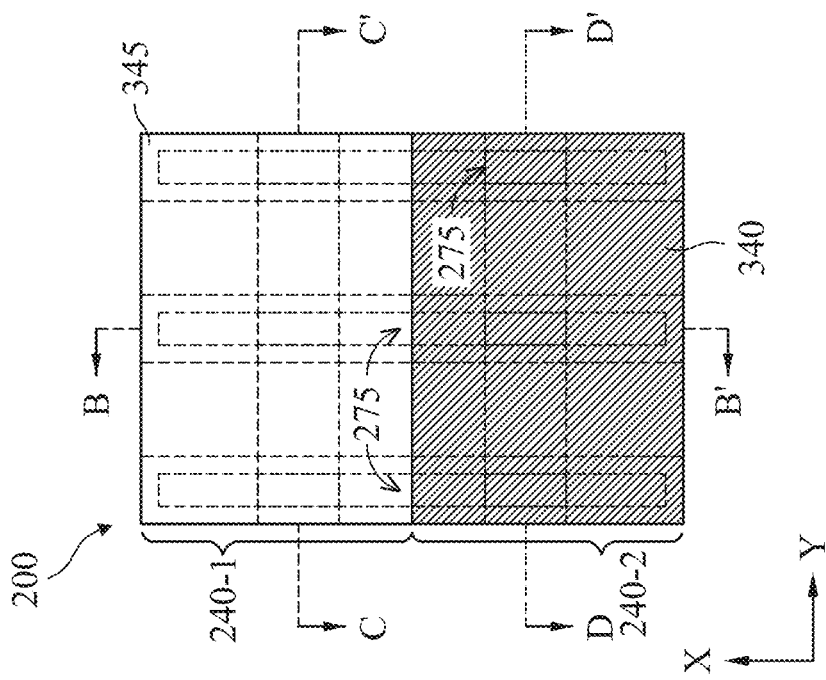
Figures 13C, 13D:
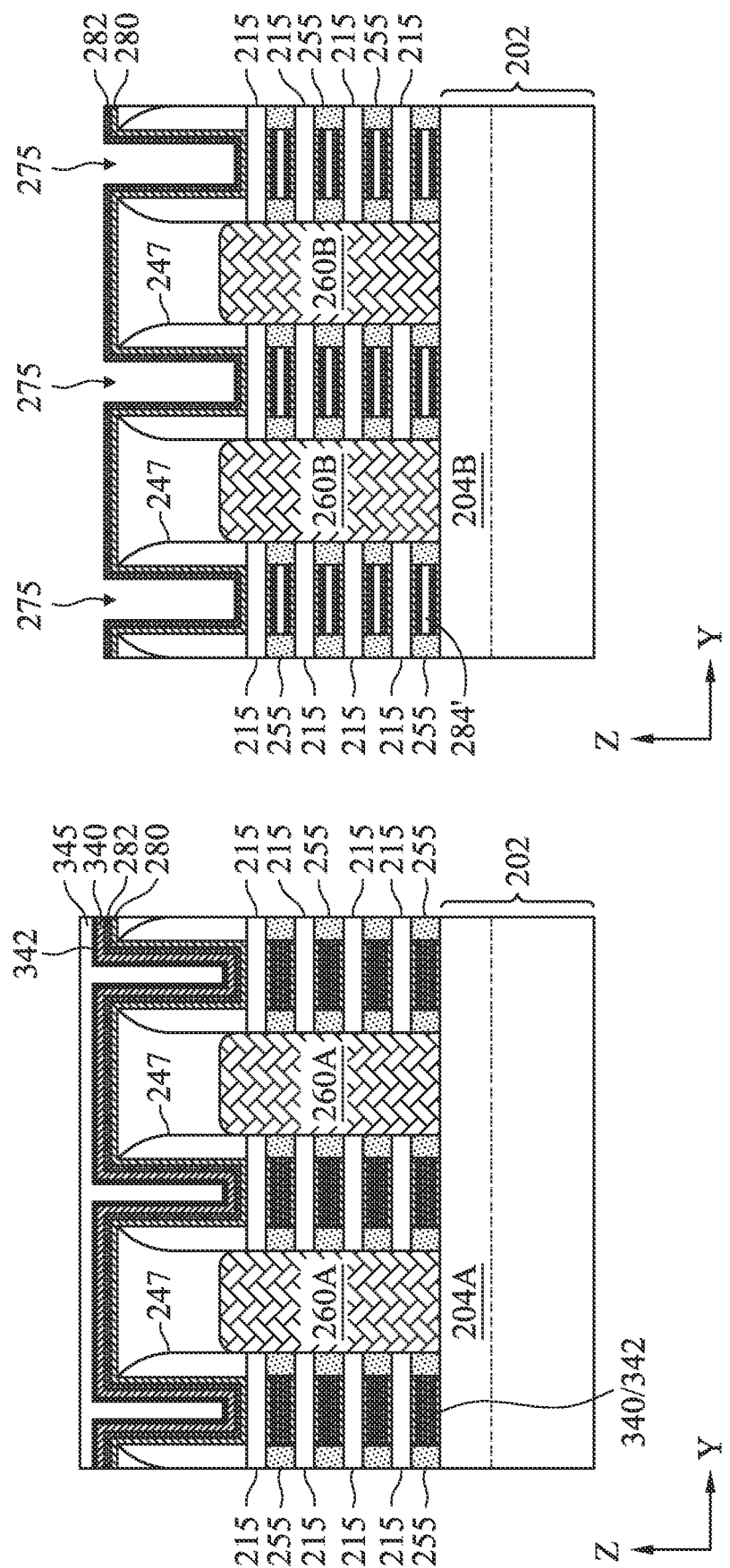

In an alternative embodiment where the n-type work function metal layer 340 fully fills the gaps 277A between the adjacent channel layers 215 and between the channel layers 215 and the substrate 202 in the n-type device region 240-1, the passivation layer 342 is deposited over the n-type work function metal layer 340 and does not wrap around each of the channel layers 215, as shown in FIG. 10B-1. However, having the passivation layer 342 wrapping around each of the channel layers 215 in the n-type device region 240-1 (e.g., FIG. 10B) generally improves $V_t$ uniformity among the channel layers 215 (essentially, each channel layer 215 is turned on/off at about the same threshold voltage) over the embodiment of FIG. 10B-1. In some embodiments, the method 100 omits the operation 118 and does not form the passivation layer 342 over the n-type work function metal layer 340 (as shown in FIG. 18D, for example). However, having the passivation layer 342 generally improves the $V_t$ uniformity among the channel layers 215 in the n-type device region 240-1 over the embodiments where the passivation layer 342 is omitted.

The method 100 (FIG. 1A) then proceeds to operations 120, 122, 124, 126, and 128 to remove the passivation layer 342, the n-type work function metal layer 340, and the sacrificial features 284' from the p-type device region 240-2.

Turning to FIGS. 11A-11D, at the operation 120, the method 100 (FIG. 1B) forms a mask (or an etch mask) 345 having one or more openings 346. The mask 345 covers the n-type GAA transistor regions including the n-type device region 240-1 and exposes the p-type GAA transistor regions including the p-type device region 240-2 through the openings 346. The mask 345 includes a material that is different than the respective materials of the sacrificial features 284', the passivation layer 342, and the n-type work function metal layer 340 to achieve etching selectivity during the removal of the layers 284', 342, and 340. For example, the mask 345 may include a resist material (and thus may be referred to as a patterned resist layer and/or a patterned photoresist layer). In some embodiments, the mask 345 has a multi-layer structure, such as a resist layer disposed over an anti-reflective coating (ARC) layer. The present disclosure contemplates other materials for the mask 345, so long as etching selectivity is achieved during the removal of the layers 284', 340, and 342 as discussed above. In some embodiments, the operation 120 includes a lithography process that includes forming a resist layer over the device 200 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 345) includes a resist pattern that corresponds with the photomask, where the patterned resist layer covers the n-type GAA transistor regions including the n-type device region 240-1 and exposes the p-type GAA transistor regions including the p-type device region 240-2. Alternatively, the exposure process can be implemented or replaced by other methods, such as maskless lithography, e-beam writing, ion-beam writing, or combinations thereof.

Turning to FIGS. 12A-12D, at the operation 122, the method 100 (FIG. 1B) removes the passivation layer 342 from the p-type device region through the openings 346 using one or more etching processes. For example, the operation 122 may implement a dry etching process, a wet etching process, or a combination thereof. The etchant is tuned to remove the material of the passivation layer 342 but does not (or insignificantly) etch the mask 345.

Turning to FIGS. 13A-13D, at the operation 124, the method 100 (FIG. 1B) removes the n-type work function metal layer 340 from the p-type device region through the openings 346 using one or more etching processes. For example, the operation 124 may implement a dry etching process, a wet etching process, or a combination thereof. The etchant is tuned to remove the material of the n-type work function metal layer 340 but does not (or insignificantly) etch the mask 345.

For operations 122 and 124, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. Further, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

In some embodiments, the operations 122 and 124 may be combined into one etching process that etches both the passivation layer 342 and the n-type work function metal layer 340. Further, the operations 122 and 124 are controlled so that there is minimal or no lateral over-etching of the passivation layer 342 and the n-type work function metal layer 340 under the mask 345. As a result of the operations 122 and 124, the gate dielectric layer 279 (including the high-k dielectric layer 282 and the interfacial layer 280) and the sacrificial features 284' are exposed in the gate trench 275 and through the opening 346 in the p-type device region 240-2.

Figures 14A, 14B:
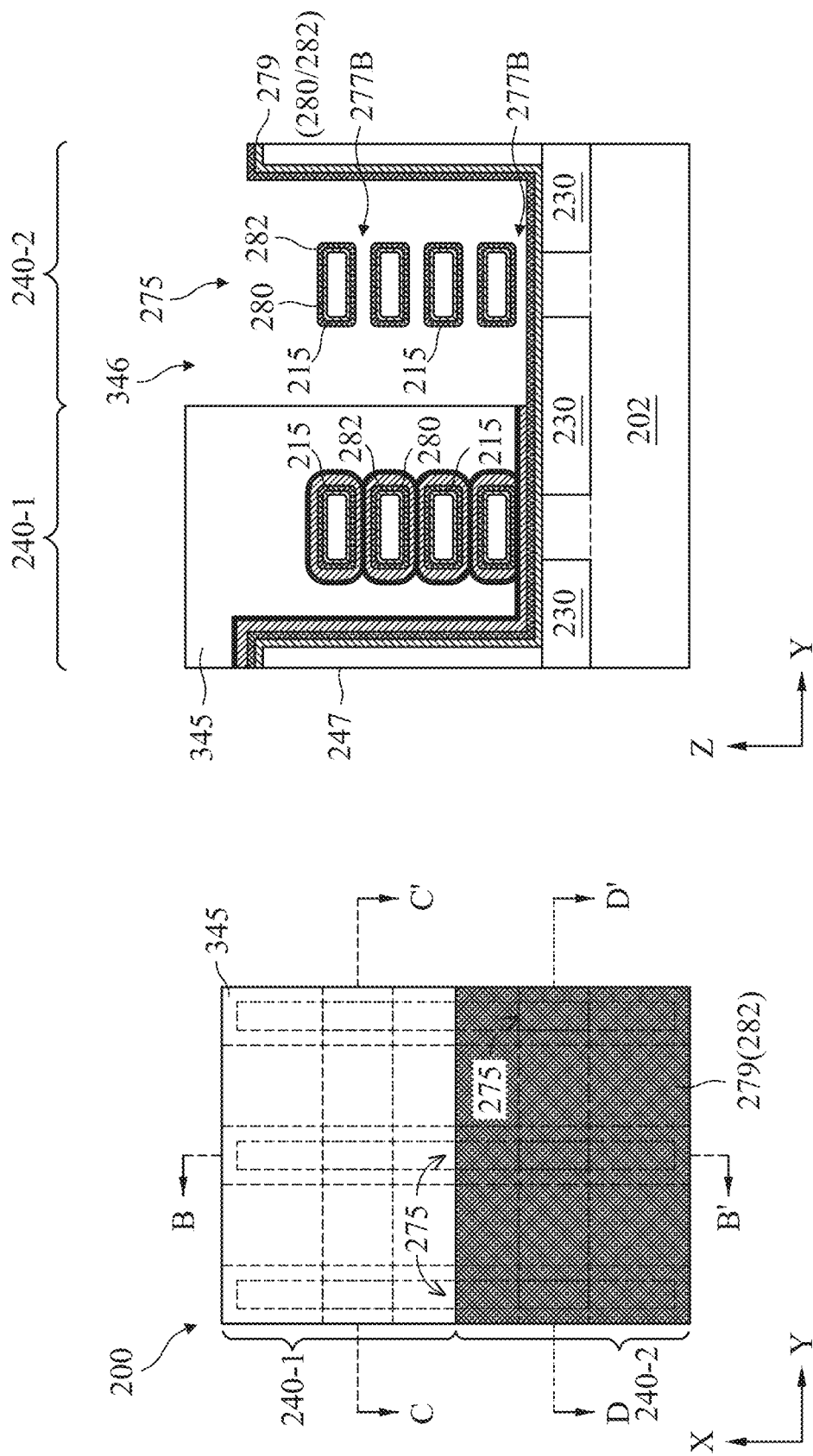
Figures 14C, 14D:
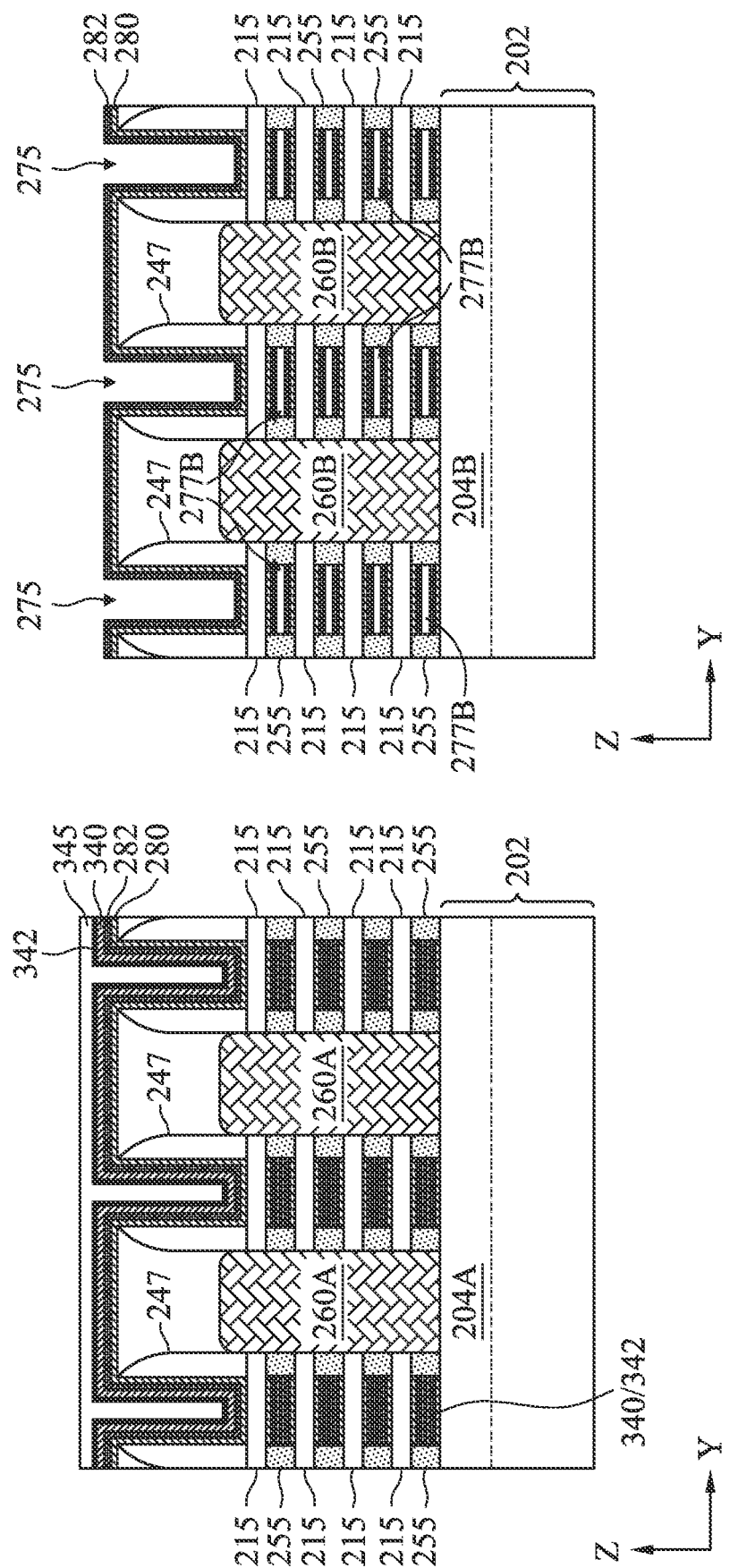
Figures 15A, 15B:
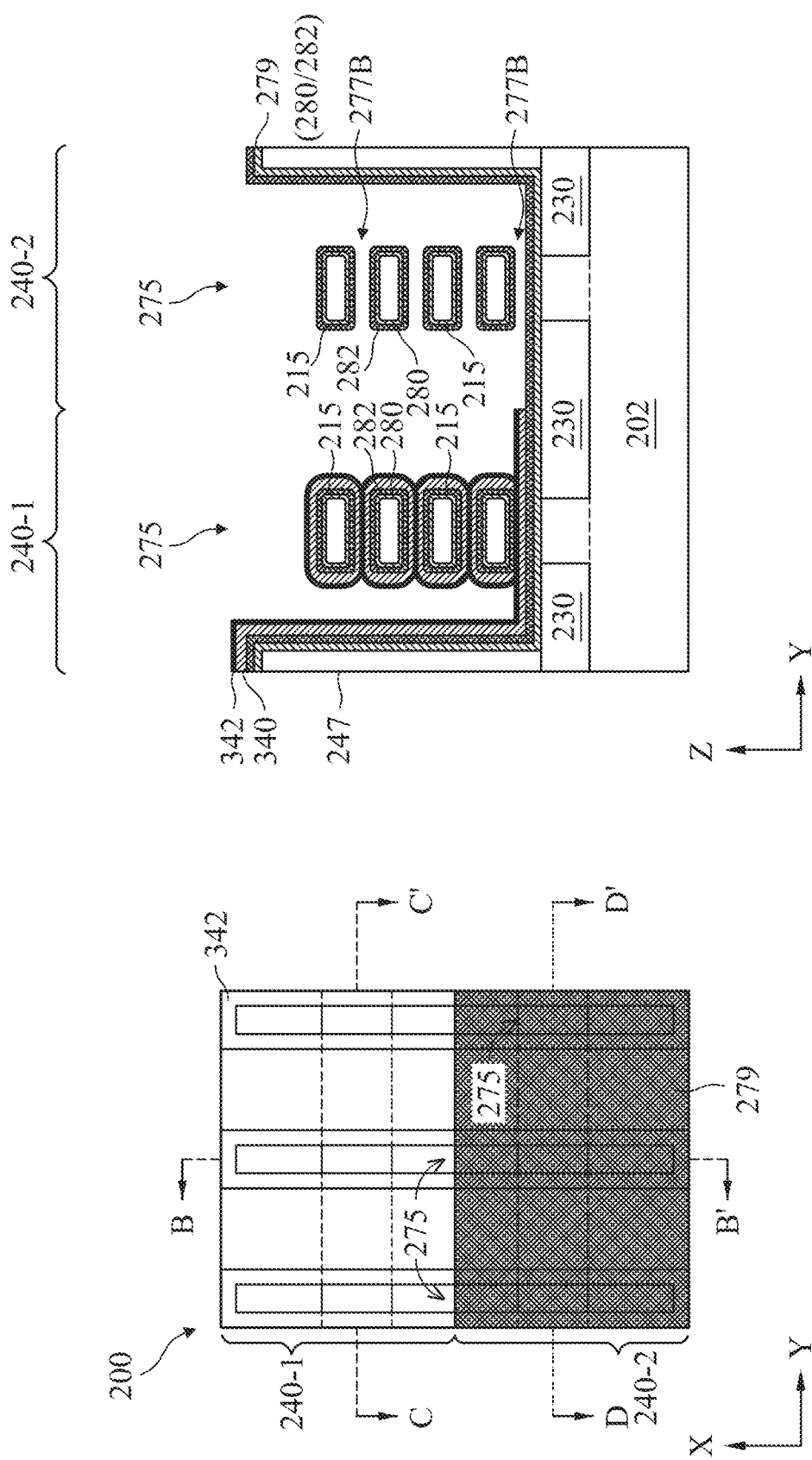
Figures 15C, 15D:
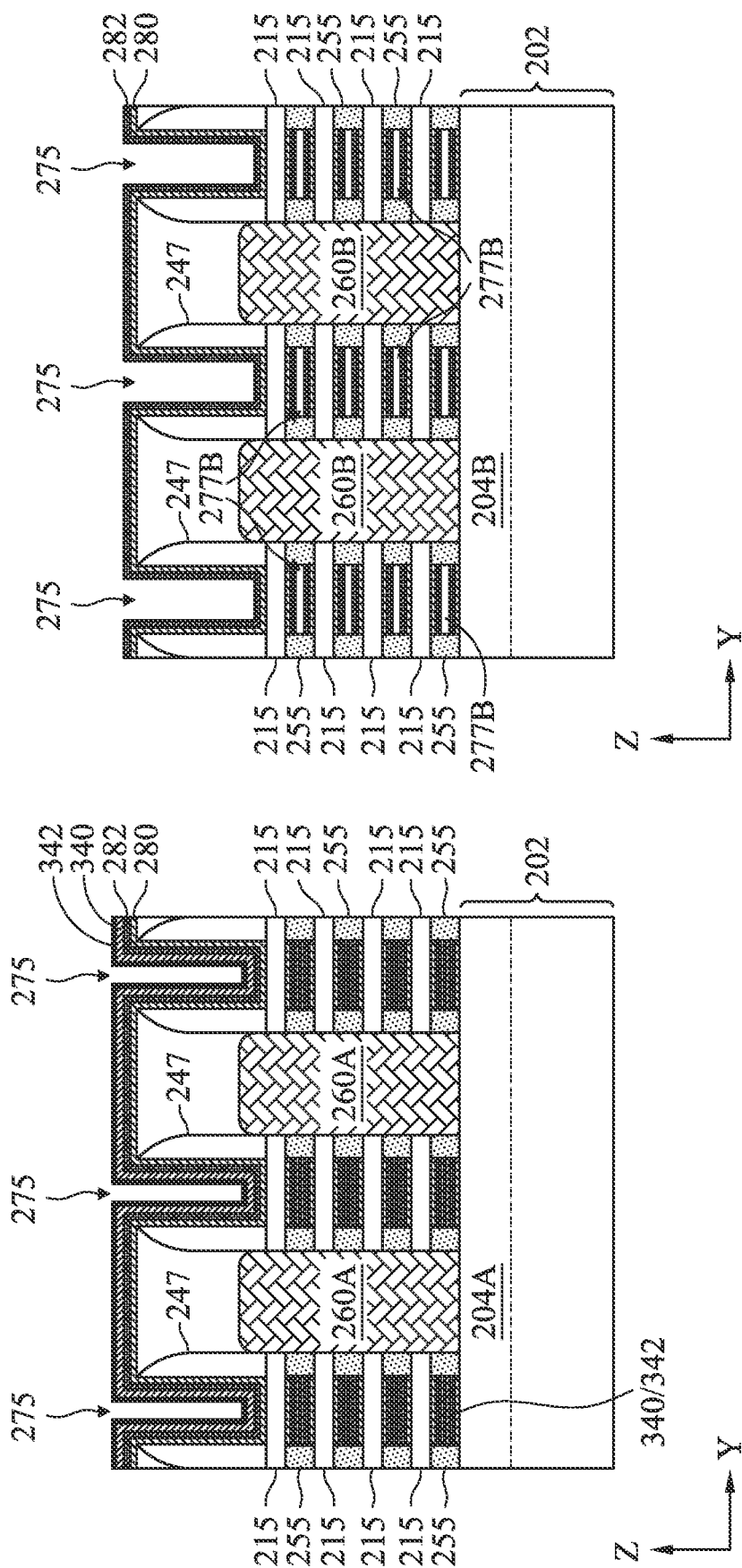

Turning to FIGS. 14A-14D, at the operation 126, the method 100 (FIG. 1B) removes the sacrificial features 284' from the p-type device region 240-2 through the opening 346. The operation 126 may use the same etching process as that is used in the operation 112. Alternatively, the operation 126 may use a different etching process than that is used in the operation 112. The etching process completely removes the sacrificial features 284' between the channel layers 215 and between the channel layers 215 and the substrate 202 in the p-type device region 240-2, thereby exposing the gate dielectric layer 279 (which includes the high-k dielectric layer 282) in the p-type device region 240-2. The etching process essentially re-claims or re-forms a portion of gaps 277B in the p-type device region 240-2. As depicted in FIGS. 14B and 14D, the gaps 277B re-appear between the adjacent channel layers 215 and between the channel layers 215 and the substrate 202 in the p-type device region 240-2. In some embodiments, the etching process is a wet etching process that uses an etching solution having a high etching selectivity with respect to the sacrificial features 284' relative to the high-k dielectric layer 282. In some embodiments, the etching solution exhibits an etching selectivity of about 10 to about 100. In some embodiments, the etching selectivity is greater than or equal to 100. In some embodiments, the wet etching process implements an $NH_4OH$-based wet etching solution. Parameters of the etching process (such as etching temperature, etching solution concentration, etching time, other suitable wet etching parameters, or combinations thereof) are controlled to ensure complete removal of the sacrificial features 284' in the p-type device regions 240-2. For example, an etching time (i.e., how long the sacrificial features 284' are exposed to the ammonia-based wet etching solution) is tuned to completely remove the sacrificial features 284' with minimal (to no) etching of high-k dielectric layer 282. In some embodiments, the etching solution further has an etching selectivity with respect to sacrificial features 284' relative to the mask 345.

Further, the operation 126 is controlled so that there is minimal or no lateral over-etching of the passivation layer 342 and the n-type work function metal layer 340 under the mask 345. In some embodiments, the lateral recess of the passivation layer 342 and the n-type work function metal layer 340 under the mask 345 is 5 nm or less. In any event, the end of the passivation layer 342 and the n-type work function metal layer 340 still remain directly on top of the isolation features 230. Compared with approaches where the gaps 277B are filled with n-type work function metal layer(s) instead of the sacrificial features 284', the present embodiments are able to reduce the lateral recess of the passivation layer 342 and the n-type work function metal layer 340 under the mask 345 because work function metal layer(s) are generally more difficult to etch than the material(s) of the sacrificial features 284'. Further, the present embodiments do not leave any residues of n-type work function metal layer(s) in the gaps 277B. Residues of n-type work function metal layer typically contain aluminum and would diffuse into p-type work function metal layer subsequently deposited into the gaps 277B. Having no such residue improves the $V_t$ uniformity in the p-type GAA devices.

After the etching process, the mask 345 is removed, for example, by a resist stripping process or other suitable process at the operation 128 of the method 100 (FIG. 1B). Turning to FIGS. 15A-15D, in the p-type device region 240-2, the gate dielectric layer 279 is exposed in the gate trenches 275 and the gaps 277B appear between the adjacent channel layers 215 and between the channel layer 215 and the substrate 202. In the n-type device region 240-1, the n-type work function metal layer 340 and the passivation layer 342 are exposed in the gate trench 275. Further, the n-type work function metal layer 340 and the passivation layer 342 wrap around (surround) the channel layers 215 and fill in the space between the adjacent channel layer 215 and between the channel 215 and the substrate 202.

Figure 16B:
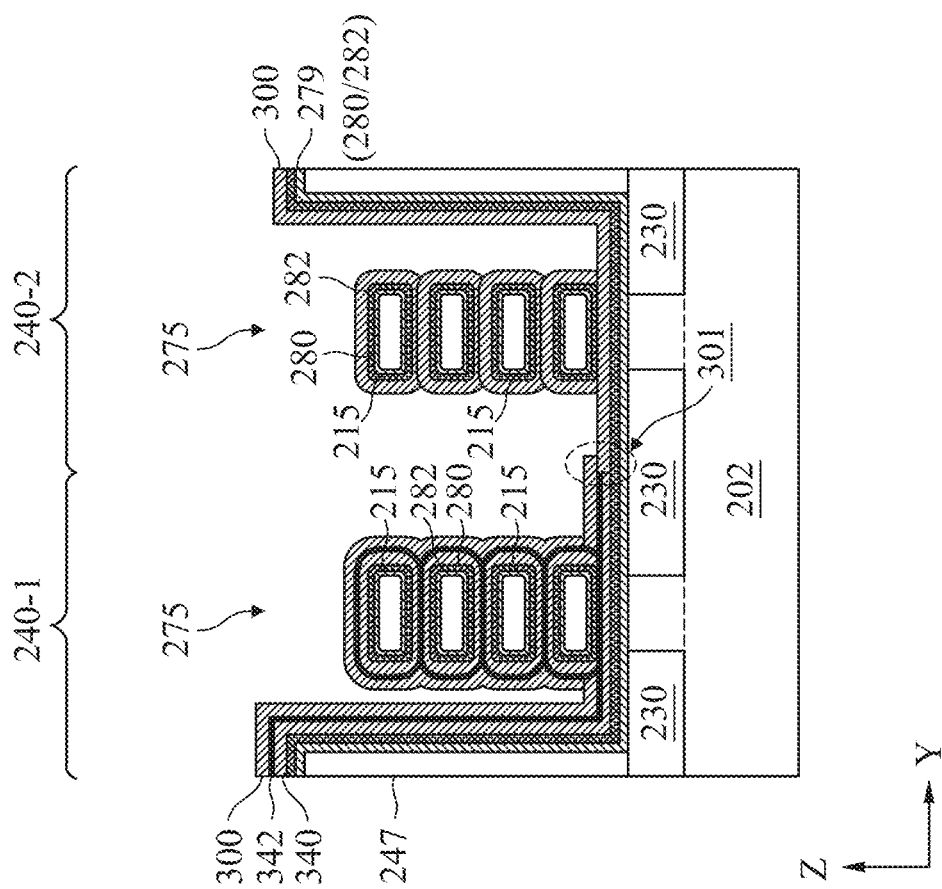
Figure 16A:
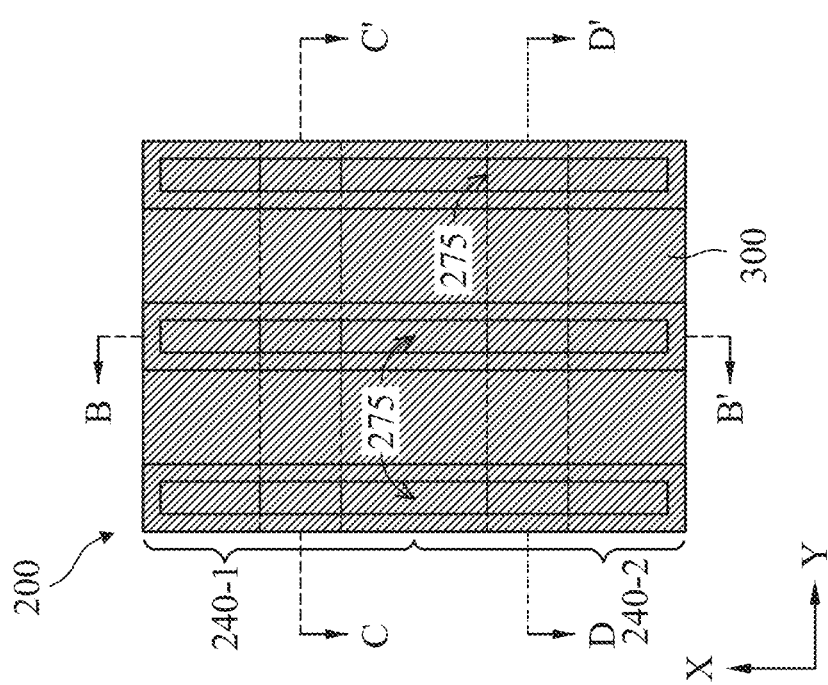
Figure 16C:
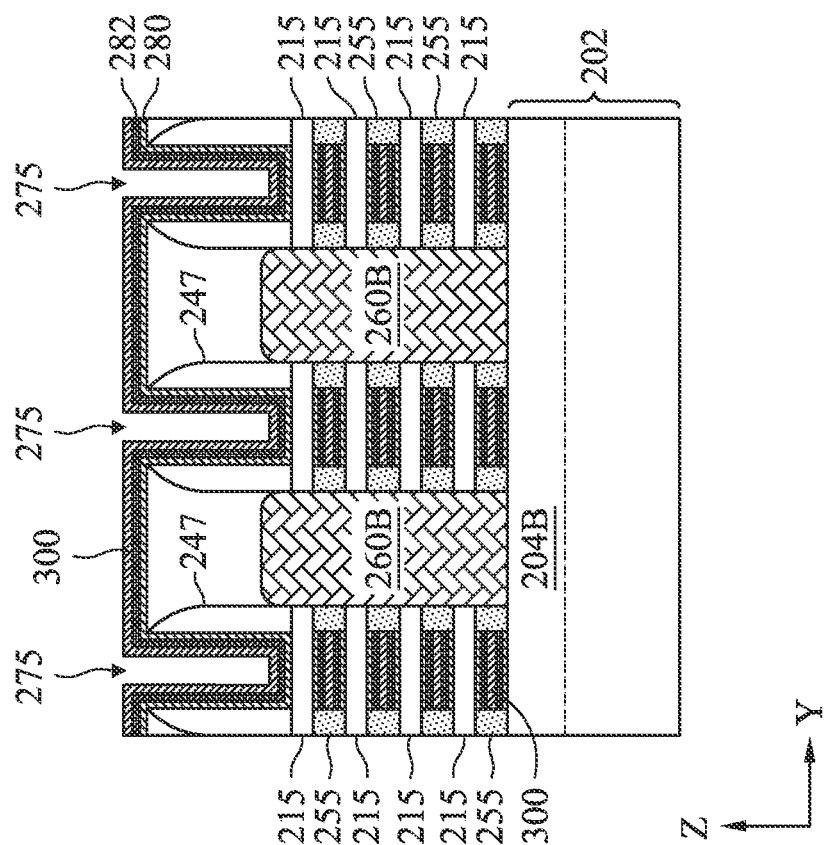
Figure 16D:
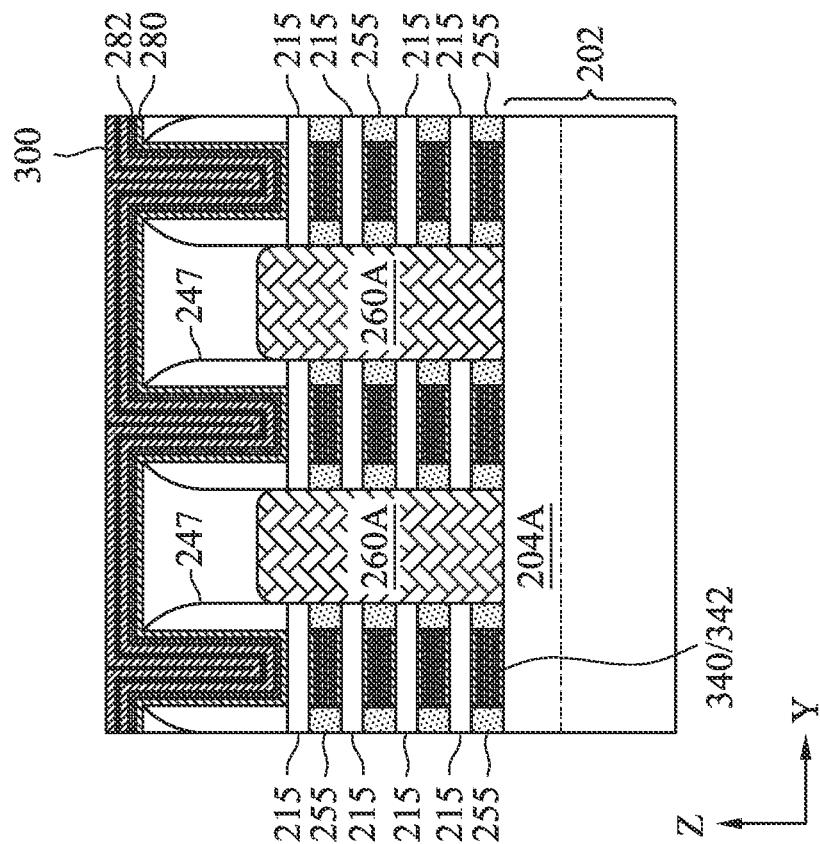

Turning to FIGS. 16A-16D, at the operation 130, the method 100 (FIG. 1B) forms a p-type work function metal layer 300 over the gate dielectric layer 279 (including layers 280 and 282 in this embodiment) in the p-type device region 240-2 and over the n-type work function metal layer 340 and the passivation layer 342 in the n-type device region 240-1. Particularly, the p-type work function metal layer 300 wraps around (surrounds) each of the channel layers 215 in the p-type device region 240-2 and fills any remaining portions of the gaps 277B between the adjacent channel layers 215 and between the channel layer 215 and the substrate 202. In the n-type device region 240-1, since the n-type work function metal layer 340 and the passivation layer 342 already fill the gaps 277A, the p-type work function metal layer 300 is only deposited on bottom and sidewall surfaces of the gate trench 275 as well as on top and side surfaces of the n-type work function metal layer 340 and the passivation layer 342. In some embodiments, the p-type work function metal layer 300 has a thickness of about 2 nm to about 5 nm. The p-type work function metal layer 300 includes any suitable p-type work function material, such as TiN, TaN, TaSN, Ru, Mo, Al, WN, WCN, $ZrSi_2$, $MoSi_2$, $TaSi_2$, $NiSi_2$, other p-type work function material, or combinations thereof. In the depicted embodiment, the p-type work function metal layer 300 includes titanium and nitrogen, such as TiN. The p-type work function metal layer 300 can be formed using any suitable deposition process, such as CVD, PVD, ALD, or combinations thereof. FIG. 16B illustrates a step 301 of the p-type work function metal layer 300 above the isolation feature 230 at the boundary of the n-type and p-type device regions. The height of the step 301 (the distance from the upper surface of the step 301 in the n-type device region 240-1 to the upper surface of the step 301 in the p-type device region 240-2) is about equal to the thickness of the n-type work function metal layer 340 (about 1 nm to 5 nm such as from 2 nm to 4 nm) and the passivation layer 342 (about 1 nm to 2 nm).

Turning to FIGS. 17A-17D, at the operation 132, the method 100 (FIG. 1B) forms a bulk metal layer 350 over the p-type work function layer 300 in both the n-type device region 240-1 and the p-type device region 240-2. For example, a CVD process or a PVD process deposits the bulk metal layer 350, such that it fills any remaining portion of gate trenches 275. The bulk metal layer 350 includes a suitable conductive material, such as Al, W, and/or Cu. The bulk metal layer 350 may additionally or collectively include other metals, metal oxides, metal nitrides, other suitable materials, or combinations thereof. In some implementations, a passivation layer (or a blocking layer) 352 (e.g., shown in FIG. 18B) is optionally formed (e.g., by ALD) over the p-type work function layer 300 before forming the bulk metal layer 350, such that the bulk metal layer 350 is disposed on the blocking layer. The passivation layer 352 may have a substantially uniform thickness and includes a material that blocks and/or reduces diffusion between gate layers, such as the bulk metal layer 350 and the p-type work function metal layers 300. In some embodiments, the operation 132 is omitted and the bulk metal layer 350 is not deposited and is omitted in the device 200.

After the bulk metal layer 350 is deposited, a planarization process may then be performed to remove excess gate materials from the device 200. For example, a CMP process is performed until a top surface of ILD layer 270 is reached (exposed). In the depicted embodiment, the device 200 are thus configured with two different metal gate portions—n-metal gates 360A in the n-type device region 240-1 and p-metal gates 360B in the p-type device region 240-2. The top surface of the gates 360A and 360B are substantially planar with a top surface of ILD layer 270. The n-metal gates 360A include the gate dielectric layer 279 (e.g., including the interfacial layer 280 and the high-k dielectric layer 282) and a gate electrode (e.g., including the n-type work function metal layer 340, the passivation layer 342, the p-type work function metal layer 300, and the bulk metal layer 350). The p-metal gates 360B include the gate dielectric layer 279 (e.g., including the interfacial layer 280 and the high-k dielectric layer 282) and a gate electrode (e.g., including the p-type work function metal layer 300 and the bulk metal layer 350). Accordingly, the device 200 includes n-type GAA transistors having metal gates 360A wrapping around respective channel layers 215 and disposed between respective epitaxial source/drain features 260A, and p-type GAA transistors having metal gates 360B wrapping around respective channel layers 215 and disposed between respective epitaxial source/drain features 260B.

Figures 17A, 17B:
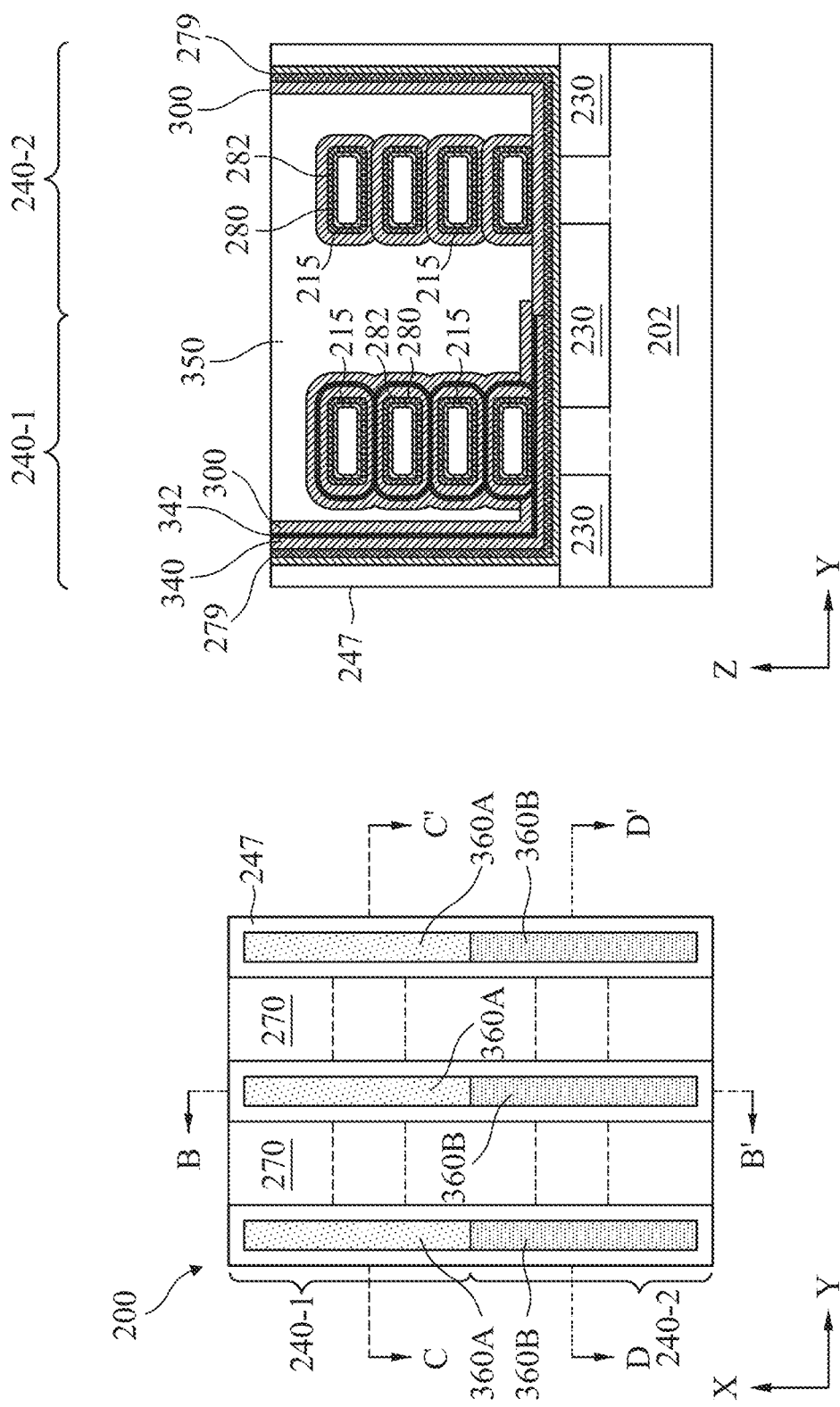
Figure 17C:
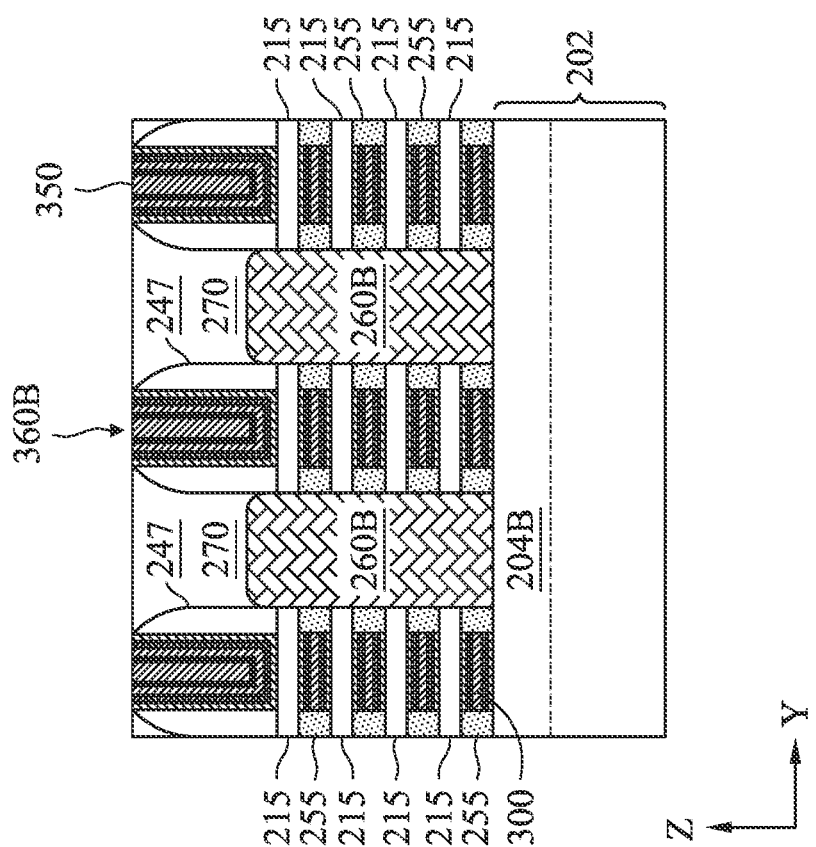
Figure 17D:
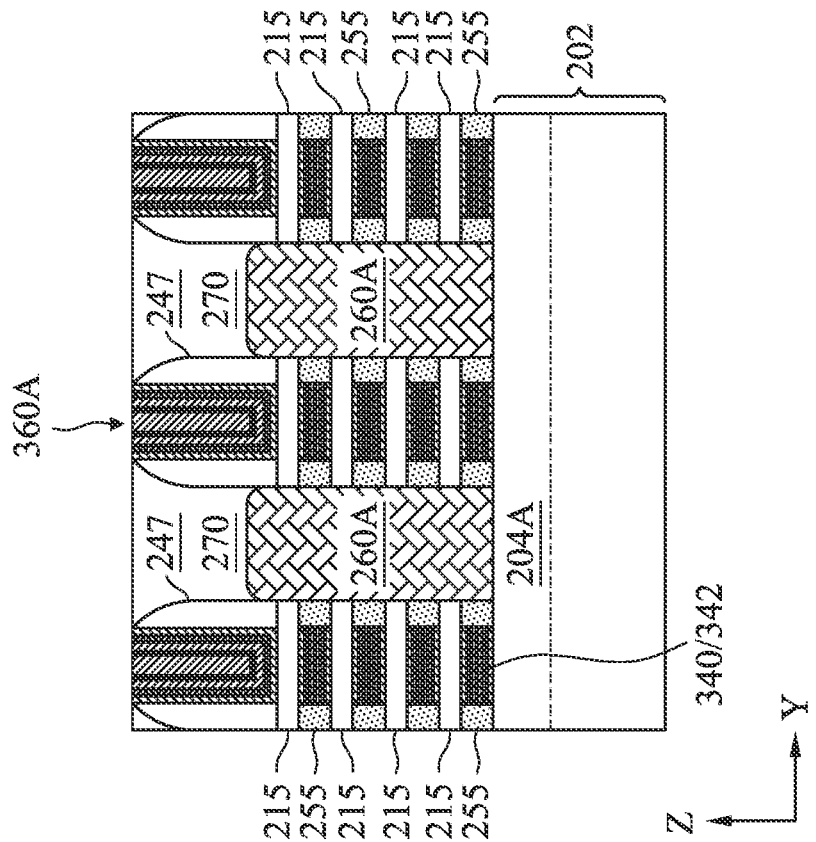
Figure 18B:
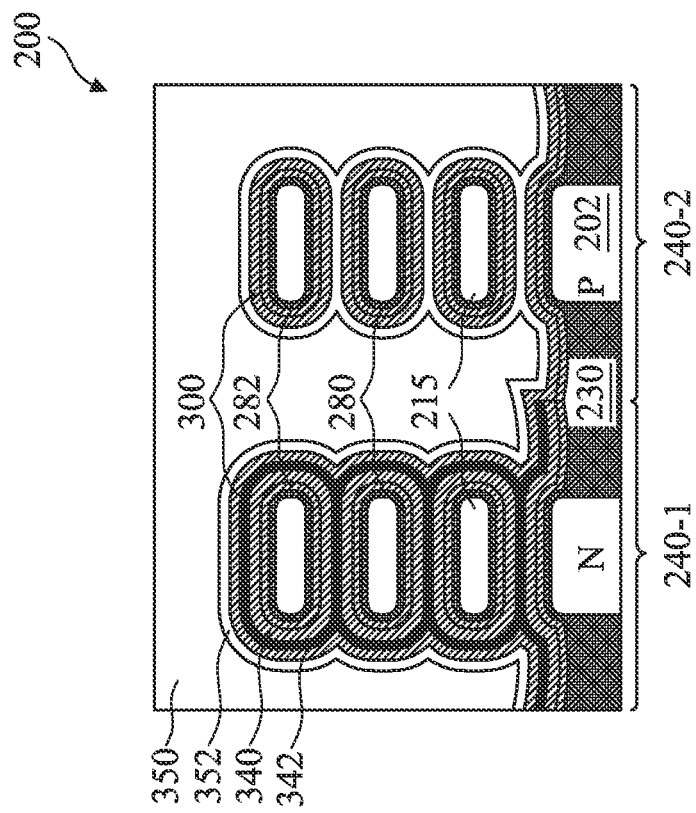
FIGS. 18A, 18B, 18C, 18D, 19A, 19B, and 19C are fragmentary diagrammatic views of a multi-gate device, in portion, according to various aspects of the present disclosure.
Figure 18A:
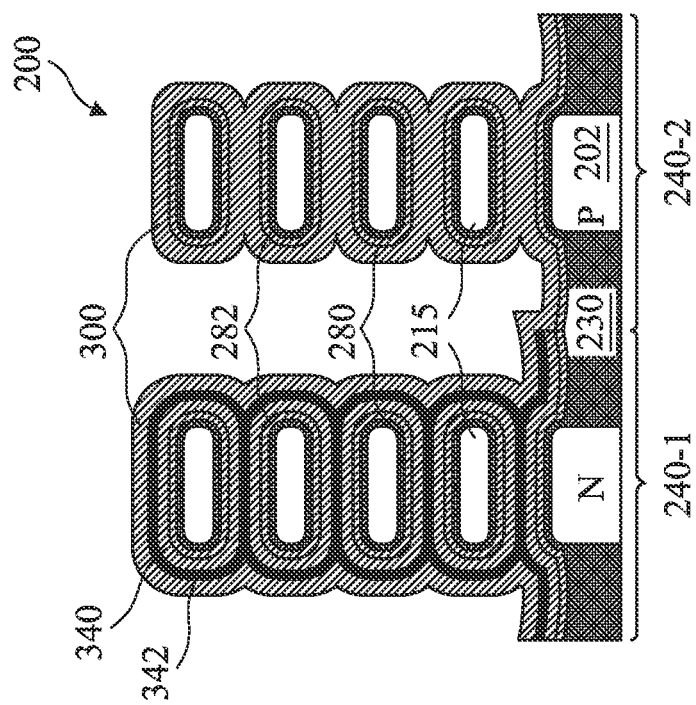
Figure 18C:
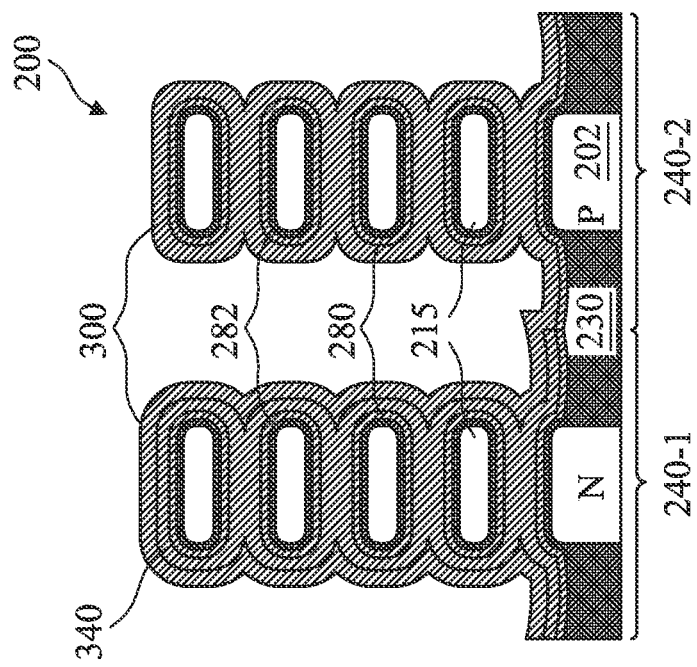
Figure 18D:
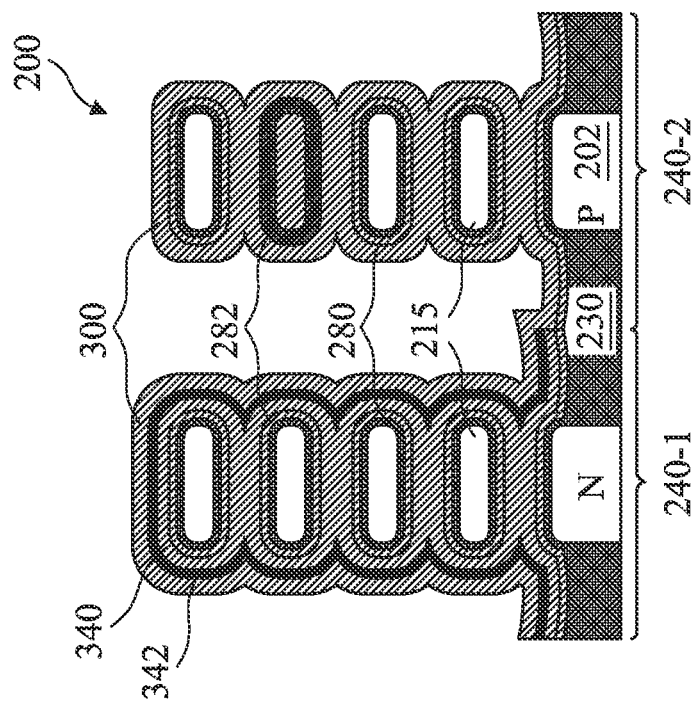

FIGS. 18A-18D illustrate various embodiments of the device 200 along the B-B' line of FIG. 17A. FIG. 18A further illustrates the various layers 215, 280, 282, 340, 342, and 300 in both the n-type device region 240-1 and the p-type device region 240-2, as discussed above, for example, with reference to FIG. 16B. FIG. 18B illustrates the same structure shown in FIG. 18A and further shows the bulk metal layer 350 and the passivation layer 352 between the p-type work function metal layer 300 and the bulk metal layer 350. The passivation layer 352 may include the same or similar material as the passivation layer 342. In the embodiment depicted in FIG. 18B, the passivation layer 352 is formed to wrap around (or surround) each of the channel layers 215 in the p-type device region 240-2. In an alternative embodiment (not shown), the p-type work function metal layer 300 fully fills any gaps between the adjacent channel layers 215 and between the channel layer 215 and the substrate 202 (such as shown in FIG. 16B), and the passivation layer 352 is formed over the p-type work function metal layer 300 but does not wrap around the channel layers 215.

FIG. 18C illustrates an embodiment where the n-type work function metal layer 340 fully fills any gaps between the adjacent channel layers 215 and between the channel layer 215 and the substrate 202 in the n-type device region 240-1. As a result, the passivation layer 342 is formed over the n-type work function metal layer 340 but does not wrap around the channel layers 215. FIG. 18D illustrates an embodiment where the passivation layer 342 is omitted in the device 200. Other aspects of FIG. 18D are the same as those of FIG. 18C.

Figures 19A, 19B, 19C:
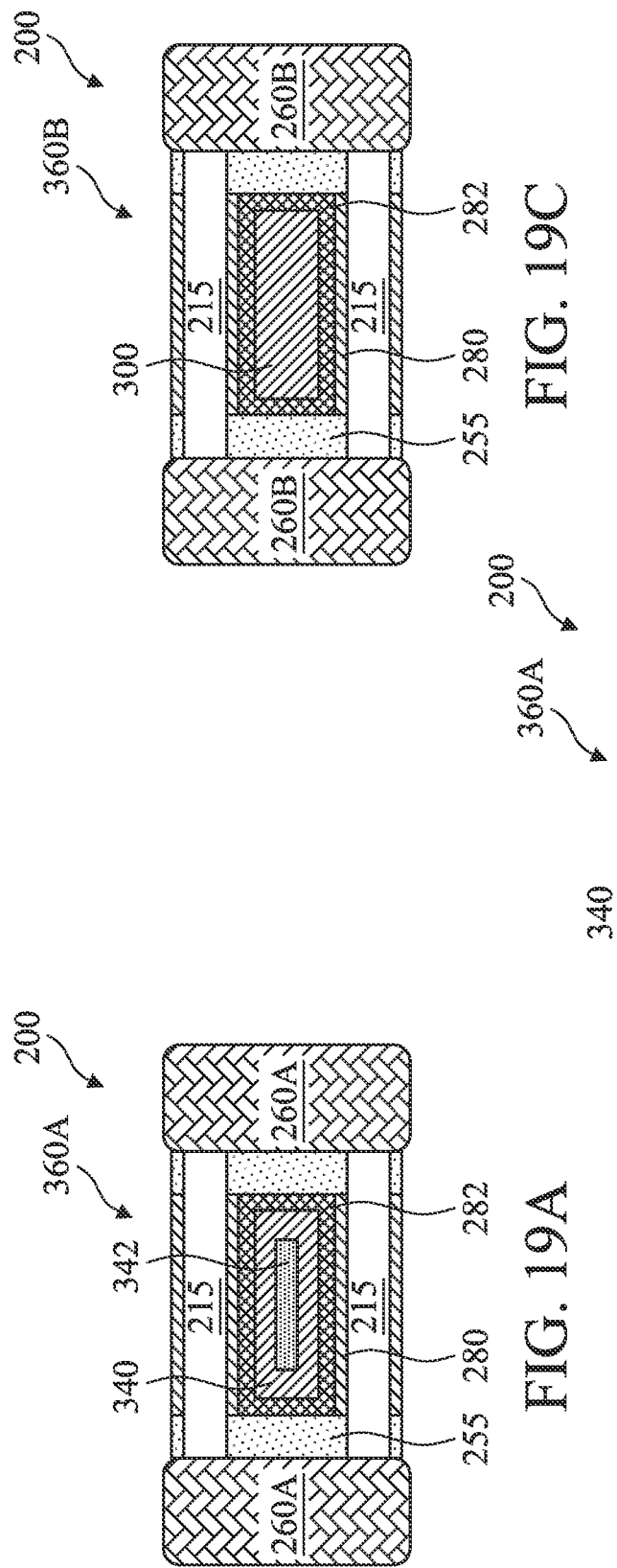

FIGS. 19A-19B illustrate various embodiments of the device 200 along the C—C' line of FIG. 17A in greater detail. FIG. 19A is a partial view of the embodiment shown in FIG. 17C. Referring to FIG. 19A, the channel layers 215 are suspended between and connected to the pair of source/drain features 260A. The inner spacer 255 are disposed vertically between the channel layers 215 and laterally between the source/drain features 260A and the n-metal gate 360A which includes the interfacial layer 280, the high-k dielectric layer 282, the n-type work function metal layer 340, and the passivation layer 342. The layers 280, 282, 340, and 342 collectively fill the space between the two channel layers 215. In the embodiment depicted in FIG. 19B, the passivation layer 342 is omitted and the layers 280, 282, and 340 collectively fill the space between the two channel layers 215. The embodiment shown in FIG. 19B corresponds to the embodiment shown in FIG. 18C. FIG. 19C illustrates an embodiment of the device 200 along the D-D' line of FIG. 17A in greater detail. FIG. 19C is a partial view of the embodiment shown in FIG. 17D. Referring to FIG. 19C, the channel layers 215 are suspended between and connected to the pair of source/drain features 260B. The inner spacer 255 are disposed vertically between the channel layers 215 and laterally between the source/drain features 260B and the p-metal gate 360B which includes the interfacial layer 280, the high-k dielectric layer 282, and the p-type work function metal layer 300. The layers 280, 282, and 300 collectively fill the space between the two channel layers 215.

The method 100 (FIG. 1B) may perform further fabrication steps in the operation 134. For example, various contacts can be formed to facilitate operation of the n-type GAA transistors and the p-type GAA transistors. For example, one or more ILD layers, similar to ILD layer 270, and/or CESL layers can be formed over substrate 202 (in particular, over ILD layer 270 and gate structures 360A, 360B). Contacts can then be formed in ILD layer 270 and/or ILD layers disposed over ILD layer 270. For example, contacts are respectively electrically and/or physically coupled with the gate structures 360A, 360B and source/drain regions of the n-type GAA transistors and the p-type GAA transistors (particularly, epitaxial source/drain features 260A, 260B). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 270 and the contacts (for example, extending through ILD layer 270 and/or the other ILD layers) are a portion of a multi-layer interconnect feature.

Although not intended to be limiting, one or more embodiments of the present disclosure provide many benefits to a semiconductor device and the formation thereof. For example, embodiments of the present disclosure provide a process for patterning n-type metal gates and p-type metal gates for CMOS devices. The process forms sacrificial features filling the gaps between adjacent channel layers and between channel layers and substrate. Then, it deposits a n-type work function metal layer and patterns it before depositing a p-type work function metal layer. It prevents the metals in the n-type work function metal layer from diffusing into the p-type work function metal layer and affecting the p-type devices' threshold voltage. The present embodiments can be readily integrated into existing CMOS fabrication processes.

In one example aspect, the present disclosure is directed to a method. The method includes providing a structure having a p-type region and an n-type region, the p-type region having first channel layers, the n-type region having second channel layers. The method further includes forming a gate dielectric layer around the first channel layers and around the second channel layers and forming a sacrificial layer around the gate dielectric layer in both the p-type region and the n-type region, wherein the sacrificial layer merges in space between the first channel layers and merges in space between the second channel layers. The method further includes etching the sacrificial layer such that only portions of the sacrificial layer in the space between the first channel layers and in the space between the second channel layers remain; forming a first mask covering the p-type region and exposing the n-type region; with the first mask in place, removing the sacrificial layer from the n-type region; and removing the first mask. After the removing of the first mask, the method further includes forming an n-type work function metal layer around the gate dielectric layer in the n-type region and over the gate dielectric layer and the sacrificial layer in the p-type region.

In some embodiments, the method further includes forming a second mask covering the n-type region and exposing the p-type region after the forming of the n-type work function metal layer and removing the n-type work function metal layer from the p-type region and removing the sacrificial layer from the p-type region with the second mask in place. The method further includes removing the second mask and forming a p-type work function metal layer over the n-type work function metal layer in the n-type region and around the gate dielectric layer in the p-type region. In a further embodiment, the method further includes forming a gate electrode over the p-type work function metal layer in both the n-type region and the p-type region. In another further embodiment, the method further includes forming a passivation layer over the n-type work function metal layer in both the n-type region and the p-type region after the forming of the n-type work function metal layer and removing the passivation layer from the p-type region before or concurrently with the removing of the n-type work function metal layer from the p-type region. In some embodiments, the passivation layer includes a layer of alumina, a layer of silicon, a layer of silicon dioxide, or a layer of silicon dioxide over a layer of silicon. In some embodiments, the passivation layer merges in space between the second channel layers.

In some embodiments of the method, the gate dielectric layer includes an interfacial layer and a high-k dielectric layer over the interfacial layer. In some embodiments of the method, the sacrificial layer includes alumina, titanium nitride, or silicon oxycarbide. In some embodiments of the method, the n-type work function metal layer includes TiAlC, TiAl, TiC, TaAlC, TiSiAlC, or a bi-layer of TiAlC and TiN.

In another example aspect, the present disclosure is directed to a method. The method includes providing a structure having first channel layers in a p-type region and second channel layers in an n-type region; forming a high-k dielectric layer around the first channel layers and around the second channel layers; forming a sacrificial layer around the high-k dielectric layer in both the p-type region and the n-type region, wherein the sacrificial layer merges in space between the first channel layers and merges in space between the second channel layers; etching the sacrificial layer such that only portions of the sacrificial layer in the space between the first channel layers and in the space between the second channel layers remain; and forming a first mask covering the p-type region and exposing the n-type region. The method further includes removing the sacrificial layer from the n-type region; removing the first mask; forming an n-type work function metal layer around the high-k dielectric layer in the n-type region and over the high-k dielectric layer and the sacrificial layer in the p-type region; and forming a passivation layer over the n-type work function metal layer in both the n-type region and the p-type region, wherein the passivation layer merges in space between the second channel layers.

In some embodiments of the method, the n-type work function metal layer includes TiAlC, TiAl, TiC, TaAlC, TiSiAlC, or a bi-layer of TiAlC and TiN. In a further embodiment, the passivation layer includes a layer of silicon, a layer of silicon dioxide, or a layer of silicon dioxide over a layer of silicon. In some embodiments of the method, the sacrificial layer includes alumina or titanium nitride, or silicon oxycarbide.

In some embodiments, the method further includes forming a second mask covering the n-type region and exposing the p-type region after the forming of the passivation layer; removing the passivation layer, the n-type work function metal layer, and the sacrificial layer from the p-type region; removing the second mask; and forming a p-type work function metal layer over the n-type work function metal layer in the n-type region and around the high-k dielectric layer in the p-type region.

In some embodiments, the method further includes forming an interfacial layer around the first channel layers and around the second channel layers before the forming of the high-k dielectric layer, wherein the high-k dielectric layer is formed around the interfacial layer In yet another example aspect, the present disclosure is directed to a device that includes a substrate having a p-type region and an n-type region; first channel layers over the p-type region and second channel layers over the n-type region; a gate dielectric layer around the first channel layers and around the second channel layers; an n-type work function metal layer around the gate dielectric layer that is around the second channel layers, wherein the n-type work function metal layer is not disposed over the gate dielectric layer that is around the first channel layers; and a p-type work function metal layer around the gate dielectric layer that is around the first channel layers and over the n-type work function metal layer.

In some embodiments, the device further includes a passivation layer between the n-type work function metal layer and the p-type work function metal layer, wherein the passivation layer merges in space between the second channel layers. In a further embodiment, the passivation layer includes a layer of alumina, a layer of silicon, a layer of silicon dioxide, or a layer of silicon dioxide over a layer of silicon.

In some embodiments of the device, the p-type work function metal layer merges in space between the first channel layers. In some embodiments of the device, the n-type work function metal layer merges in space between the second channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
channel layers over the substrate;
a gate dielectric layer around the channel layers;
a first work function metal layer around the gate dielectric layer;
a second work function metal layer over the first work function metal layer; and
a passivation layer between the first work function metal layer and the second work function metal layer, wherein the passivation layer merges in space vertically between adjacent ones of the channel layers,
wherein the passivation layer comprises silicon, silicon oxide, alumina, or a combination thereof.

2. The device of claim 1, further comprising:
a bulk metal layer over the second work function metal layer and on multiple sides of the channel layers.

3. The device of claim 2, further comprising:
a blocking layer between the second work function metal layer and the bulk metal layer.

4. The device of claim 3, wherein the blocking layer comprises a semiconductor material, a dielectric material, or a bi-layer of a semiconductor material and a dielectric material.

5. The device of claim 1, wherein the first work function metal layer includes TiAlC, TiAl, TiC, TaAlC, TiSiAlC, or a bi-layer of TiAlC and TiN.

6. The device of claim 1, wherein the second work function metal layer includes TiN, TaN, TaSN, Ru, Mo, Al, WN, WCN, $ZrSi_2$, $MoSi_2$, $TaSi_2$, or $NiSi_2$.

7. The device of claim 1, wherein the channel layers are first channel layers over an n-type region of the substrate, further comprising:
second channel layers over a p-type region of the substrate, wherein the gate dielectric layer is also disposed around the second channel layers, and the second work function metal layer is disposed directly on the gate dielectric layer that is around the second channel layers.

8. The device of claim 7, further comprising:
a bulk metal layer over the second work function metal layer, on multiple sides of the first channel layers, and on multiple sides of the second channel layers.

9. The device of claim 8, further comprising:
a blocking layer between the second work function metal layer and the bulk metal layer, wherein the blocking layer merges in space vertically between adjacent ones of the second channel layers.

10. A device, comprising:
a substrate having a p-type region and an n-type region;
first channel layers over the p-type region and second channel layers over the n-type region;
a gate dielectric layer around the first channel layers and around the second channel layers;
an n-type work function metal layer around the gate dielectric layer that is around the second channel layers, wherein the n-type work function metal layer is not disposed over the gate dielectric layer that is around the first channel layers;
a p-type work function metal layer around the gate dielectric layer that is around the first channel layers and over the n-type work function metal layer; and
a passivation layer between the n-type work function metal layer and the p-type work function metal layer, wherein the passivation layer is free in a space vertically between adjacent ones of the second channel layers and is not disposed over the p-type region.

11. The device of claim 10, wherein the passivation layer includes a layer of alumina, a layer of polysilicon or amorphous silicon, a layer of silicon dioxide, or a layer of silicon dioxide over a layer of polysilicon or amorphous silicon.

12. The device of claim 10, wherein the n-type work function metal layer merges in the space vertically between adjacent ones of the second channel layers.

13. The device of claim 12, wherein the p-type work function metal layer merges in a space vertically between adjacent ones of the first channel layers.

14. The device of claim 10, further comprising:

an isolation structure laterally between the n-type region and the p-type region, wherein an end of the passivation layer and an end of the n-type work function metal layer are directly above the isolation structure.

15. The device of claim 14, wherein the end of the passivation layer and the end of the n-type work function metal layer are substantially aligned vertically.

16. The device of claim 14, further comprising:

a bulk metal layer over the p-type work function metal layer and on multiple sides of the first and the second channel layers.

17. A device, comprising:

a substrate having a p-type region and an n-type region separated by an isolation structure;

first channel layers over the p-type region and second channel layers over the n-type region;

a gate dielectric layer around the first channel layers and around the second channel layers;

an n-type work function metal layer around the gate dielectric layer that is around the second channel layers, wherein the n-type work function metal layer is not disposed over the gate dielectric layer that is around the first channel layers; and a p-type work function metal layer over the n-type work function metal layer and around the gate dielectric layer that is around the first channel layers, wherein the p-type work function metal layer directly contacts the n-type work function metal layer, wherein an end of the n-type work function metal layer is directly above the isolation structure, wherein a step in the p-type work function metal layer is directly above the isolation structure.

18. The device of claim 17, wherein the n-type work function metal layer merges in a space vertically between adjacent ones of the second channel layers.

19. The device of claim 18, wherein the p-type work function metal layer merges in a space vertically between adjacent ones of the first channel layers.

20. The device of claim 19, further comprising:

a bulk metal layer over the p-type work function metal layer and on multiple sides of the first and the second channel layers.

\* \* \* \* \*